United States Patent
Stoltz et al.

(10) Patent No.: US 11,272,638 B2
(45) Date of Patent: Mar. 8, 2022

(54) SYSTEM, METHOD, AND APPARATUS FOR INTEGRATING HIGH POWER DENSITY POWER ELECTRONICS ON A MOBILE APPLICATION

(71) Applicant: Eaton Intelligent Power Limited, Dublin (IE)

(72) Inventors: Thomas Joseph Stoltz, Allen Park, MI (US); Glenn Clark Fortune, Farmington Hills, MI (US); Elizabeth Jane Mercer, West Bloomfield, MI (US); Viken Rafi Yeranosian, Sterling Heights, MI (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/853,184

(22) Filed: Apr. 20, 2020

(65) Prior Publication Data

US 2020/0404804 A1   Dec. 24, 2020

Related U.S. Application Data

(60) Provisional application No. 62/864,340, filed on Jun. 20, 2019.

(51) Int. Cl.
*H05K 7/20* (2006.01)
*H02K 11/33* (2016.01)

(52) U.S. Cl.
CPC ......... *H05K 7/20254* (2013.01); *H02K 11/33* (2016.01)

(58) Field of Classification Search
None
See application file for complete search history.

(56) References Cited

U.S. PATENT DOCUMENTS

| | | | | |
|---|---|---|---|---|
| 4,938,280 A | * | 7/1990 | Clark | .................... H01L 23/427 |
| | | | | 165/80.4 |
| 5,242,314 A | * | 9/1993 | Di Giulio | ............ H01R 12/714 |
| | | | | 439/289 |

(Continued)

FOREIGN PATENT DOCUMENTS

| DE | 4202083 A1 | 7/1993 |
|---|---|---|
| DE | 4204384 A1 | 8/1993 |

(Continued)

OTHER PUBLICATIONS 16862958.2, "European Application Serial No. 16/862,958.2, Extended European Search Report dated Jul. 12, 2019", Eaton Intelligent Power Limited, 9 pages.

(Continued)

*Primary Examiner* — Courtney L Smith
(74) *Attorney, Agent, or Firm* — GTC Law Group PC & Affiliates

(57) ABSTRACT

A motor drive converter includes a cold plate having a first side and a second side, the first side being opposite to the second side. The motor drive converter may further include at least one motor phase power electronics disposed on the first side of the cold plate, and a capacitor array disposed on the second side of the cold plate. The cold plate may include slots therethrough for a conductor to pass through the cold plate. The conductor may be configured to electrically coupling the capacitor array and the at least one motor phase power electronics.

24 Claims, 21 Drawing Sheets

(56) References Cited

U.S. PATENT DOCUMENTS

| | | | |
|---|---|---|---|
| 5,631,821 A * | 5/1997 | Muso | H05K 7/20927 361/709 |
| 6,600,980 B1 | 7/2003 | Kraska et al. | |
| 6,878,092 B1 | 4/2005 | Schustek et al. | |
| 6,887,180 B2 | 5/2005 | Pels et al. | |
| 7,104,920 B2 | 9/2006 | Beaty et al. | |
| 8,037,784 B2 | 10/2011 | Raoul | |
| 8,760,855 B2 * | 6/2014 | Howes | H05K 7/20936 361/677 |
| 9,315,187 B2 | 4/2016 | Stenson | |
| 9,579,964 B2 | 2/2017 | Piazza et al. | |
| 9,794,630 B2 | 10/2017 | Sanchez-Leighton | |
| 10,071,662 B2 | 9/2018 | Choi et al. | |
| 10,622,755 B1 * | 4/2020 | Gonzalez Delgadillo | H01R 13/521 |
| 10,696,151 B2 | 6/2020 | Stoltz | |
| 10,850,623 B2 * | 12/2020 | Chung | B60K 1/00 |
| 11,084,373 B2 | 8/2021 | Fortune et al. | |
| 11,124,058 B2 | 9/2021 | Stoltz et al. | |
| 11,130,388 B2 | 9/2021 | Stoltz | |
| 2002/0104397 A1 | 8/2002 | Bowen | |
| 2004/0230847 A1 * | 11/2004 | Patwardhan | H02M 1/126 713/300 |
| 2005/0101432 A1 | 5/2005 | Pels et al. | |
| 2005/0139035 A1 | 6/2005 | Lee et al. | |
| 2006/0092611 A1 * | 5/2006 | Beihoff | B60L 50/15 361/698 |
| 2007/0265126 A1 | 11/2007 | Janson et al. | |
| 2007/0267233 A1 | 11/2007 | Wenthen | |
| 2007/0284159 A1 | 12/2007 | Takami et al. | |
| 2008/0130223 A1 * | 6/2008 | Nakamura | H02M 7/003 361/689 |
| 2009/0115372 A1 | 5/2009 | Naganuma et al. | |
| 2009/0140694 A1 | 6/2009 | Zeng | |
| 2009/0228150 A1 | 9/2009 | Alston | |
| 2010/0078234 A1 | 4/2010 | Bissontz | |
| 2010/0114442 A1 | 5/2010 | Kadota | |
| 2010/0219007 A1 | 9/2010 | Dalum et al. | |
| 2010/0224429 A1 | 9/2010 | Akiyama | |
| 2011/0120160 A1 | 5/2011 | Dietrich | |
| 2011/0126652 A1 | 6/2011 | Genise et al. | |
| 2011/0198139 A1 | 8/2011 | Fuechtner | |
| 2011/0259145 A1 | 10/2011 | Hellenbroich et al. | |
| 2011/0307153 A1 | 12/2011 | Razaznejad et al. | |
| 2012/0240723 A1 | 9/2012 | Gluckler et al. | |
| 2013/0053201 A1 | 2/2013 | Holmes et al. | |
| 2013/0058801 A1 | 3/2013 | Cheng et al. | |
| 2013/0186235 A1 | 7/2013 | Morimoto et al. | |
| 2013/0187453 A1 * | 7/2013 | Flett | F28F 3/00 307/23 |
| 2014/0027089 A1 | 1/2014 | Hisada | |
| 2014/0171260 A1 | 6/2014 | Dalum | |
| 2015/0135863 A1 | 5/2015 | Dalum | |
| 2015/0207344 A1 | 7/2015 | Wang et al. | |
| 2016/0052382 A1 | 2/2016 | Clark et al. | |
| 2016/0201558 A1 * | 7/2016 | Pal | F02C 7/16 60/39.83 |
| 2016/0217898 A1 * | 7/2016 | Kozuru | H02B 13/02 |
| 2017/0001622 A1 | 1/2017 | Lindstrom et al. | |
| 2018/0001740 A1 | 1/2018 | Vehr et al. | |
| 2018/0251019 A1 | 9/2018 | Stoltz | |
| 2019/0135107 A1 | 5/2019 | Fortune et al. | |
| 2019/0140474 A1 | 5/2019 | Stoltz et al. | |
| 2019/0193524 A1 | 6/2019 | Stoltz | |
| 2019/0256077 A1 | 8/2019 | Stoltz | |
| 2020/0114757 A1 | 4/2020 | Gasparovic et al. | |
| 2020/0247239 A1 | 8/2020 | Stoltz | |
| 2020/0254865 A1 | 8/2020 | Stoltz et al. | |

FOREIGN PATENT DOCUMENTS

| | | | |
|---|---|---|---|
| EP | 1097831 A2 | 5/2001 | |
| EP | 1199468 A2 | 4/2002 | |
| EP | 2264334 A1 | 12/2010 | |
| EP | 2514620 A1 | 10/2012 | |
| EP | 2957444 A1 | 12/2015 | |
| EP | 3300239 A1 | 3/2018 | |
| EP | 3755131 A1 | 12/2020 | |
| FR | 2835301 A1 | 8/2003 | |
| JP | S58128926 A | 8/1983 | |
| JP | 2003232412 A | 8/2003 | |
| JP | 2012105419 A | 5/2012 | |
| JP | 2014011926 A | 1/2014 | |
| WO | 02078987 A2 | 10/2002 | |
| WO | 2013113103 A1 | 8/2013 | |
| WO | 2017079423 A1 | 5/2017 | |
| WO | 2018085406 A1 | 5/2018 | |
| WO | 2019092023 A2 | 5/2019 | |
| WO | 2019092026 A1 | 5/2019 | |
| WO | 2019092023 A3 | 7/2019 | |
| WO | 2020187989 A1 | 9/2020 | |

OTHER PUBLICATIONS 17867121.0, "European Application Serial No. 17867121.0, Extended European Search Report dated Jul. 9, 2020", Eaton Intelligent Power Limited, 7 pages.

20170308.9, "European Application Serial No. 20170308.9, Extended European Search Report dated Sep. 21, 2020", Eaton Intelligent Power Limited, 10 pages.

Mckay, B., "Benefits of a 48V P2 Mild Hybrid", Continental Powertrain Technology & Innovation, Sep. 30, 2016, 20 Pages.

PCT/EP18/80480, "International Application Serial No. PCT/EP18/80480, International Search Report and Written Opinion dated Jun. 19, 2019", Eaton Corporation, 21 pages.

PCT/EP18/80485, "International Application Serial No. PCT/EP18/80485, International Search Report and Written Opinion dated Mar. 1, 2019", Eaton Corporation, 15 pages.

PCT/EP2018/080480, "International Application Serial No. PCT/EP2018/080480, Invitation to Pay Additional Fees and, Where Applicable, Protest Fee dated Mar. 20, 2019", Eaton Corporation, 12 pages.

PCT/EP2020/057458, "International Application Serial No. PCT/EP2020/057458, International Search Report and Written Opinion dated Jun. 16, 2020", Eaton Corporation, 10 pages.

PCT/US2016/060308, "International Application Serial No. PCT/US2016/060308, International Search Report and Written Opinion dated Feb. 15, 2017", Eaton Corporation, 8 pages.

PCT/US2017/059541, "International Application Serial No. PCT/US2017/059541, International Search Report and Written Opinion dated Feb. 8, 2018", Eaton Corporation, 17 pages.

Woernle, Christoph, "Counter Shaft Transmission Used for Automobile,", EPO, JP 2003-232412 A, Machine Translation of Description, Aug. 22, 2003, 7 pages.

Woernle, Christoph, "Counter Shaft Transmission Used for Automobile,", EPO, JP 2003-232412 A, English Abstract, Aug. 22, 2003, 1 page.

U.S. Appl. No. 17/446,043, filed Aug. 26, 2021, Pending, Stoltz, Thomas Joseph.

* cited by examiner

SYSTEM, METHOD, AND APPARATUS FOR INTEGRATING HIGH POWER DENSITY POWER ELECTRONICS ON A MOBILE APPLICATION

CROSS REFERENCE TO RELATED APPLICATIONS

This application claims priority to U.S. Provisional Patent Application Ser. No. 62/864,340, filed on Jun. 20, 2019, entitled SYSTEM, METHOD, AND APPARATUS FOR INTEGRATING HIGH POWER DENSITY POWER ELECTRONICS ON A MOBILE APPLICATION (EATN-2411-P01).

Each of the foregoing patent documents is incorporated herein by reference in its entirety.

GOVERNMENT LICENSE RIGHTS

This invention was made with government support under government contract #DE-EE008265 awarded by the US Department of Energy. The government has certain rights in this invention.

FIELD

The present disclosure generally relates to a driveline power take-off (PTO) system and related method for integrating and packaging power electronics having a high power density.

BACKGROUND

Previously known light hybrid (or mild hybrid) power systems for mobile applications (e.g., vehicles) are typically rated at 15 kW power levels, or lower, due to limitations in the available voltage and current limits (e.g., 300 A maximum current). Mobile applications such as vehicles suffer from a number of challenges, including packaging size constraints; limited access to favorable locations (e.g., high-quality airflow, spacing between other systems on the vehicle, etc.); limited access to supporting systems such as coolant access (and/or low-temperature coolant access); manufacturability constraints; cost constraints (installation and/or operating costs); high and/or variable vibration profiles; challenging electromagnetic environments; and/or high temperature and/or low ambient heat transfer environments. Mobile applications tend to have high volume, which increases the cost pressure for subsystems, and which increases the consequences of subsystems that fail, have low reliability or experience reduced operational capability. Many mobile applications are weight-limited, and accordingly, weight reductions or increases in a subsystem of the mobile application provide a corresponding cost or benefit to other components or provide for increased or decreased mission capacity (e.g., load weight allowable).

SUMMARY

An example system includes a power take-off (PTO) system. The PTO system may include an electric motor/generator and a power transfer element. The power transfer element may be coupled to a transmission of a vehicle and configured to selectively transfer torque from the electric motor/generator to the transmission or transfer torque from the transmission to the electric motor/generator based on a mode of the power transfer element. The PTO system may further include a motor drive converter configured to transfer electric power to the electric motor/generator or receive electric power from the electric motor/generator based at least on the mode. The motor drive converter may include a cold plate having a first side and a second side, the first side being opposite to the second side. The motor drive converter may also include at least one motor phase power electronics disposed on the first side of the cold plate, and a capacitor array disposed on the second side of the cold plate. The cold plate may include slots therethrough for a conductor to pass through the cold plate, the conductor may be configured to electrically couple the capacitor array and the at least one motor phase power electronics. The cold plate may include coolant flow channels for a liquid coolant. The conductor may be electrically insulated from the cold plate. The at least one motor phase power electronics may include at least one phase card circuit board thermally coupled to the cold plate. The PTO system may also include a plurality of bus bars electrically coupled to the at least one phase card circuit board, wherein the plurality of bus bars may be shaped as to accept an external electrical connector. The cold plate may include a coolant inlet and a coolant outlet, and the coolant outlet may be configured for a coolant connection with an electrical motor.

An example system and methods herein include a motor drive converter (MDC) that includes a cold plate having a first side and a second side, the first side being opposite to the second side. The MDC may include at least one motor phase power electronics disposed on the first side of the cold plate, and a capacitor array disposed on the second side of the cold plate. The cold plate may include slots therethrough for a conductor to pass through the cold plate, the conductor may be configured to electrically couple the capacitor array and the at least one motor phase power electronics. The cold plate may include a coolant flow channels for a liquid coolant. The cold plate may include flow control and heat transfer features. The heat transfer features may include pins within the coolant flow channels. The conductor may be electrically insulated from the cold plate. The at least one motor phase power electronics may include at least one phase card circuit board thermally coupled to the cold plate. The MDC may further include a plurality of bus bars electrically coupled to the at least one phase card circuit board. The plurality of bus bars may include a shaped end configured to accept an external electrical connector. Each of the plurality of bus bars may be electrically coupled to the at least one phase card circuit board with flexible bus bar channels configured to provide compliance movement between the plurality of bus bars and the at least one phase card circuit board. The cold plate may include a coolant inlet and a coolant outlet, and the coolant outlet may be configured for a coolant connection with an electrical motor. The motor drive converter may be sized to fit within a frame rail of a vehicle. The at least one phase card circuit may include solid-state switches that drive the plurality of bus bars for converting direct current from the capacitor array to alternating current for driving an electric motor. The MDC may further include at least one temperature sensor for monitoring coolant temperature at an inlet of the cold plate, at least one temperature sensor for monitoring coolant temperature at an outlet of the cold plate, and at least one coolant flow sensor for monitoring coolant flow through the cold plate. The MDC may also include at least one current sensor positions around each of the plurality of bus bars. The conductor may be structured to provide a force toward the cold plate for the at least one motor phase power electronics and/or the capacitor array.

An example system and methods herein include a method for assembly of a compliant motor drive converter. The method may include the step of providing a bus bar with a shaped end configured to accept a connector. The method may further include positioning the bus bar in one or more bus bar channels that provide a spring force that hold the bus bar to a driver card and provides a range of compliance movement; and positioning the bus bar through a seal on a housing, wherein a tolerance of the position of the seal on the housing is within the range of compliance movement.

BRIEF DESCRIPTION OF THE DRAWINGS

The present disclosure will become more fully understood from the detailed description and the accompanying drawings, wherein.

DETAILED DESCRIPTION

As will become appreciated from the following discussion, the instant disclosure provides embodiments that support a high power density motor drive converter (MDC). The MDC may be configured to receive and/or provide power to one or more electrical loads, such as electric motors.

Figure 1:
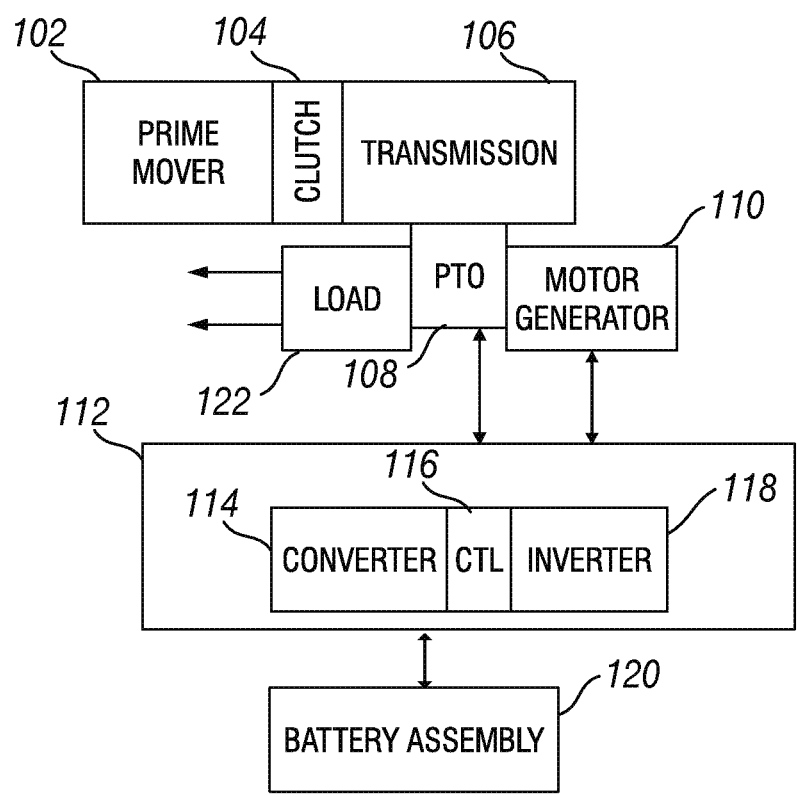
FIG. 1 is a functional block diagram for an electrically regenerative accessory drive in an embodiment of the present disclosure.

In some embodiments, the MDC may be used in power take-off (PTO) configurations in vehicles. PTO devices may include a motor/generator, where the PTO device is capable to selectively transfer power with the driveline, such as at a transmission interface. Referring to FIG. 1, a schematic block diagram of an example system with a PTO device is presented. Here, the prime mover 102 (e.g., engine) is drivingly coupled to the transmission 106 through a clutch 104. The motor/generator 110 selectively couples to the load 122 and to the transmission 106 via a torque coupling (e.g., PTO 108, which may include gearbox). The MDC 112 may include one or more of a DC-to-DC converter 114, a controller 116, and an inverter 118.

In embodiments, the system of FIG. 1 may be operated in one or more modes such as cruise mode (e.g., load 122 and/or motor generator 110 driven by an engine), motive load mode (e.g., load 122 and/or motor generator 110 driven by wheels in an engine-off down-grade condition of travel), sleep mode (e.g., motor/generator 110 operating as motor drives the load 122 with the engine off), crank mode (e.g., starting the engine from the motor/generator operating as a motor), creep mode (e.g., motor/generator operating as motor drives transmission), and the like. It will be understood that mode names are provided for clarity of description, and are not limiting to the present disclosure. In embodiments, the MDC 112 may be configured to support the different modes. The MDC 112 may be configured for an energy use mode in which the MDC receives power from a battery assembly 120 and provide power to the motor/generator 110 (for example, during sleep or crank mode). The MDC 112 may be configured for an energy storage mode in which the MDC receives power from the motor/generator 110 and provide power to the battery assembly 120 (for example, during motive load or cruise mode). The MDC may be configured to receive and provide control signals to one or more elements of the PTO 108, battery assembly 120, load 122, motor/generator 110, transmission 106, vehicle systems, cooling systems, and the like to support the modes. In some embodiments, the MDC may be configured to operate only in an energy storage mode or only in an energy usage mode. In some embodiments, the modes may be selectable by a controller, user, vehicle control systems, and the like.

By way of example only, the motor/generator 110 can be a 6-60 kW, 12-48 volt motor such as a wire-wound synchronous type motor. Previously known MDC power systems for mobile applications (e.g., vehicles) are typically rated at 15 kW power levels, or lower, due to limitations in the available voltage and current limits (e.g., 300 A maximum current). Mobile applications such as vehicles suffer from a number of challenges, including packaging size constraints; limited access to favorable locations (e.g., high-quality airflow, spacing between other systems on the vehicle, etc.); limited access to supporting systems such as coolant access (and/or low-temperature coolant access); manufacturability constraints; cost constraints (installation and/or operating costs); high and/or variable vibration profiles; challenging electromagnetic environments; and/or high temperature and/or low ambient heat transfer environments.

A significant limitation for power density in light/mild hybrid systems is the ability for the power electronics (e.g., an inverter and/or converter) to manage the power throughput required for the application. Based on simulation, modeling, and testing, it is believed that power systems for mobile applications utilizing the systems and techniques described throughout the present disclosure can achieve power densities of approximately double those for previously known systems. In certain embodiments, long haul class 8 truck applications utilizing certain systems and techniques described throughout the present disclosure can achieve a 30 kW power level for the hybrid system. In certain embodiments, one or more systems or techniques included herein may be omitted and still be within the scope of the present disclosure. MDC designs and systems presented herein provide for a high power density design using a number of design features and techniques.

Certain systems and techniques described herein reduce the inductance between the link capacitor and the switching device for an inverter powering a motor. Certain systems and techniques described herein reduce the inductance between gate driving circuitry and the switching device. The reduced inductance values allow for faster transient switching of motor phases, and/or the inclusion of a greater number of switching devices (e.g., MOSFETs).

In certain embodiments, phase currents generated by the inverter to the motor can exceed 1000 A. Certain systems and techniques described herein reduce conduction losses by reducing resistance in conduction paths within the electronics.

In certain embodiments, high power density operation of power electronics generates significant heat during operation, even where high-efficiency devices are utilized. Additionally, even sub-failure heat loads on a device can reduce the service life and/or reliability of the device, causing degradation of performance or failure before the planned service life is reached. Further, non-uniform current flows throughout power electronics components can put a higher heat burden on certain components, which is exacerbated at high power densities and, therefore, higher current ratings. Certain systems and techniques described herein provide for uniform current flows, high capability heat flows and/or cooling, and short connection links for high current components, which can be selectively combined to provide for improved thermal performance, service life, and reliability.

Figure 2:
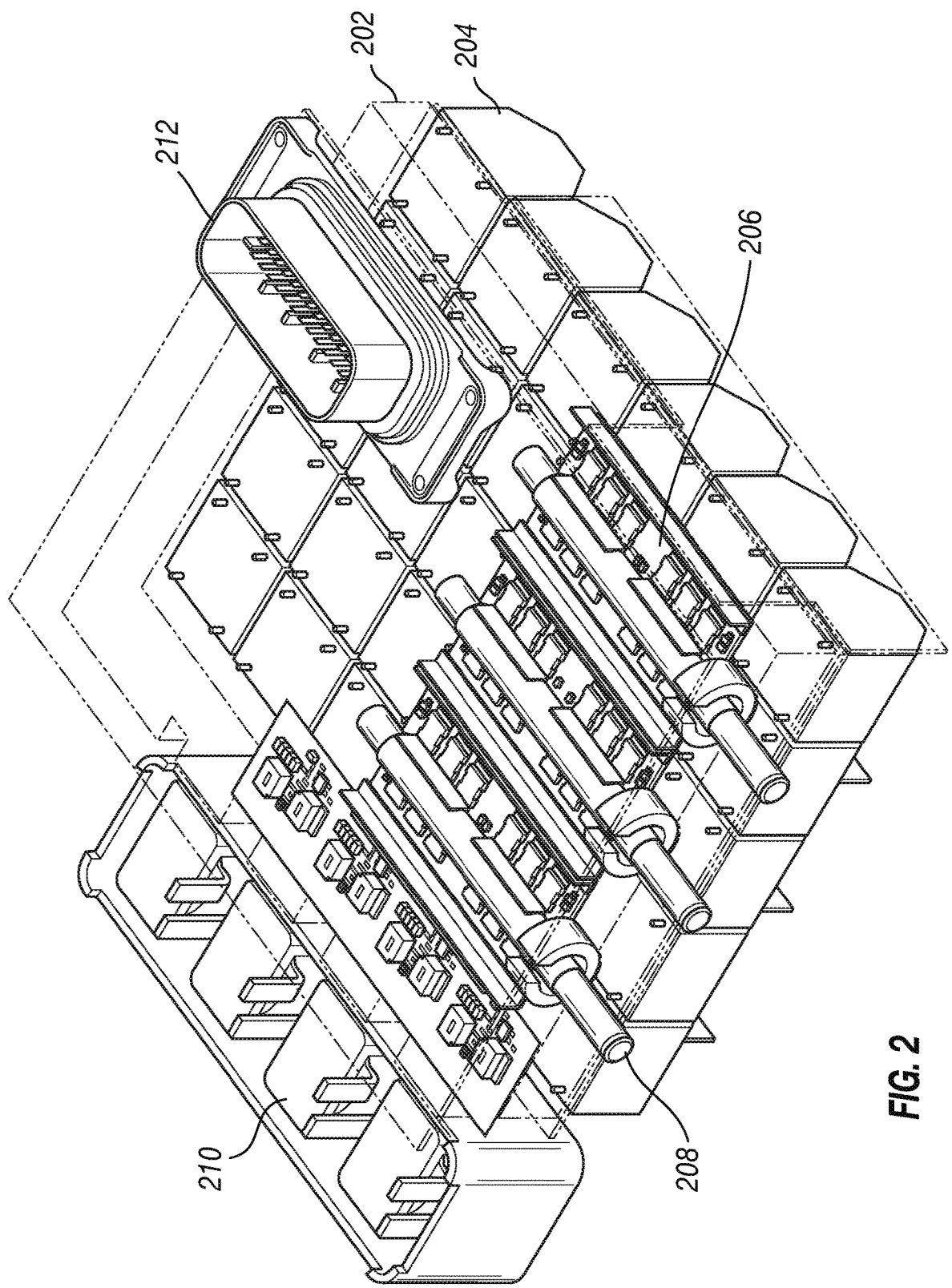
FIG. 2 shows an isometric view of aspects of an example motor drive converter.

FIG. 2 depicts an example MDC having a number of features of the present disclosure. The example MDC of FIG. 2 depicts a structure that includes a cold plate 202 (shown as a transparent box in the figure). The MDC may further include a link capacitor array 204 that may be positioned on a first side of the cold plate 202, and one or more insulated metal substrate (IMS) boards 206 (three IMS boards are depicted in the example) for motor phase power electronics which may be positioned on another side of the cold plate 202. The IMS boards 206 and the link capacitor array 204 may be electrically coupled with one or more conductors. In some embodiments, the electrical conductors that couple the IMS boards and link capacitor array may pass through one or more holes or slots in the cold plate 202. Each IMS board may include at least one bus bar 208 and various electronic components. The MDC may further include one or more inductors 210, which may be provided on the side of the cold plate. Additional connectors 212 for data and power may be provided. The MDC may be enclosed in a suitable enclosure (now shown) such that the components of the MDC are protected. Electrical connections (data and power) to the components of the MDC may be provided from the outside of an enclosure via one or more connectors 212 and/or via the ends of one or more bus bars 208 that may extend outside of the enclosure.

The example MDC provides for power electronics in a single housing, with bus bar motor phase connections that provide power to a 3-phase AC motor (or motor/generator) and/or receive power from the motor.

Figure 3:
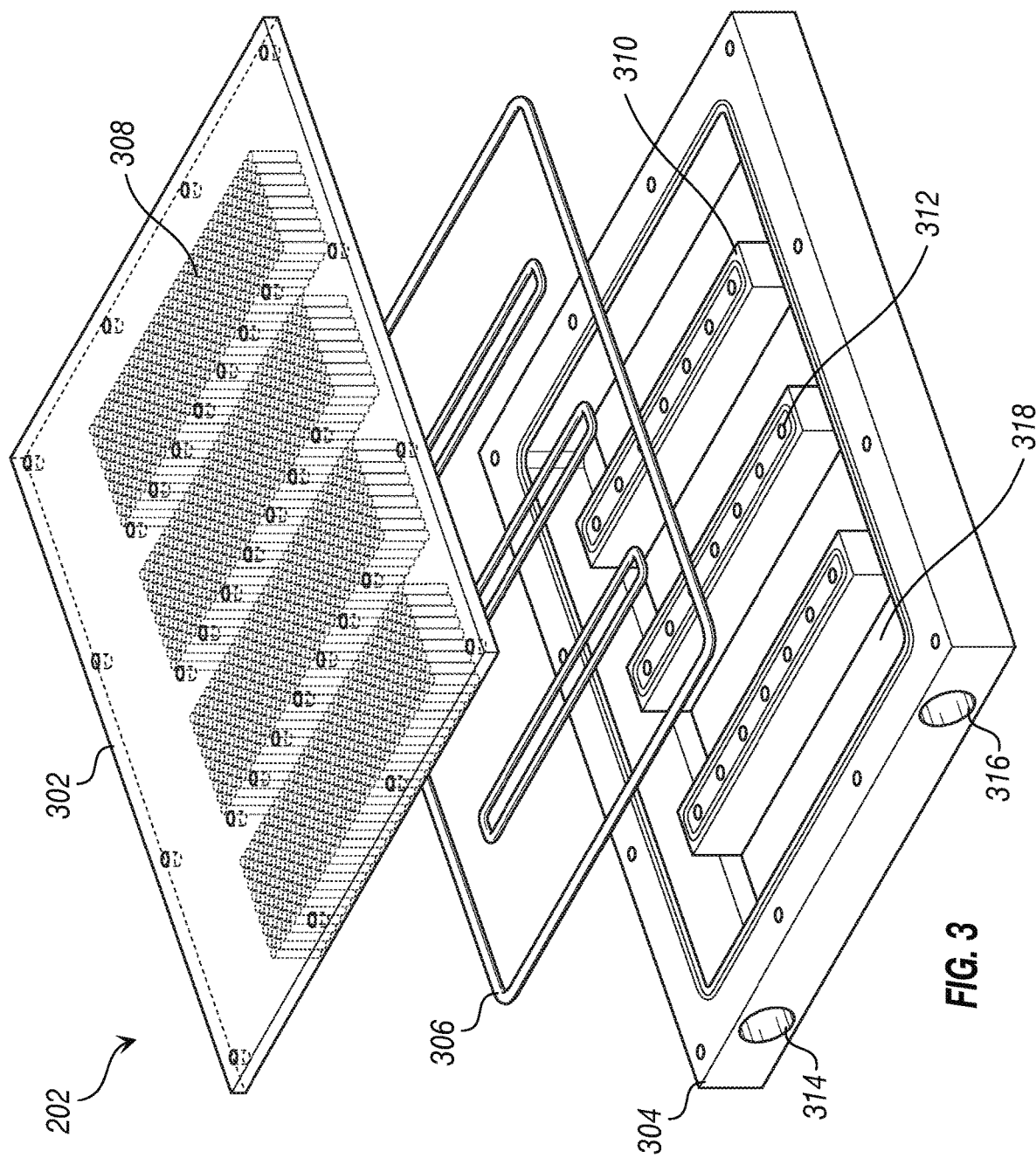
FIG. 3 shows aspects of an example cold plate.

Aspects of an example cold plate 202 are shown in FIG. 3. In embodiments, a cold plate may be a plate that may accept a coolant via one or more coolant inlets 314 or coolant outlets 316. In some embodiments, the plate may be a rectangle or a square, but any shape such as a circle, other polygons, or any other shape may be used wherein the shape may depend on the sizing constraints on the MDC. The cold plate may include one or more coolant channels 318 that allow the coolant to pass from the coolant inlet 314 to a coolant outlet 316. In some embodiments, the coolant channels 318 may include one or more coolant flow control and/or heat transfer features. In some cases, coolant flow control features may include one or more coolant barriers, channels, elements and the like that may be used to direct the coolant in the channel 318 into a specific area, may limit coolant flow, may add or remove turbulence to the coolant flow, increase coolant flow velocity, decrease coolant flow velocity, and the like. In one example, the coolant flow feature may be a barrier 310 in the coolant channel. In some cases, heat transfer features may include protrusions, indentations, pins, ridges, and the like that may increase or decrease the surface area of a part of the cold plate. In some cases, heat transfer features may extend into the coolant channel. In some cases, heat transfer features may be present on the outside of the cold plate. Heat transfer features may be located in areas that require additional cooling compared to other areas of the cold plate and may correspond to mounting or contact areas of power electronics, for example. In one example, heat transfer features may include pins 308 that extend into a coolant channel. In some embodiments, the cold plate 202 may include conductor passages 312 therethrough that provide a path for a conductor to be routed from one side of the cold plate to another side of the cold plate through the cold plate. Although shown as a round hole in FIG. 3, the conductor passage may be any shape such as one or more slots that allow a conductor shaped like a bar or a flat plate to pass through the cold plate via the slot.

In embodiments, the cold plate may be any good thermal conductor such as aluminum, copper, other metals, or other good thermal conductors. In some cases, various materials may be used for different areas of the cold plate, which may be based on the cost, thermal requirements, weight, manufacturability, and the like. In some cases, the features of the cold plate, such as coolant channels and/or the heat and flow control features may be machined, stamped, printed, and the like. In the example of FIG. 3, the cold plate may be machined out of a metal such as aluminum and may include two parts, a base 304 and a cover 302 that may be sealed by one or more seals 306 such as gaskets, O-rings, and the like.

In some embodiments, the cold plate 202 may include one or more mounting points for temperature sensors and/or coolant flow sensors. In one embodiment, temperature sensors may be located near the coolant inlets and coolant outlets 314, 316, and may monitor the temperature of the coolant entering the cold plate and/or existing the cold plate. In some cases, the temperature sensors may be within two or within 10 cm of the inlets/outlets. A coolant flow sensor may, in some embodiments, be also positioned within 10 cm of the inlet or outlet and may be used to determine the volume of coolant flow through the cold plate. In some embodiments, the temperature and flow readings of the sensors may be monitored by a control board on the MDC or by an external processor to determine cooling performance, power output, error conditions (such as a failure of components which may manifest as an increased or decreased temperature in the coolant), cooling requirements, coolant volume, and the like.

Figure 4:
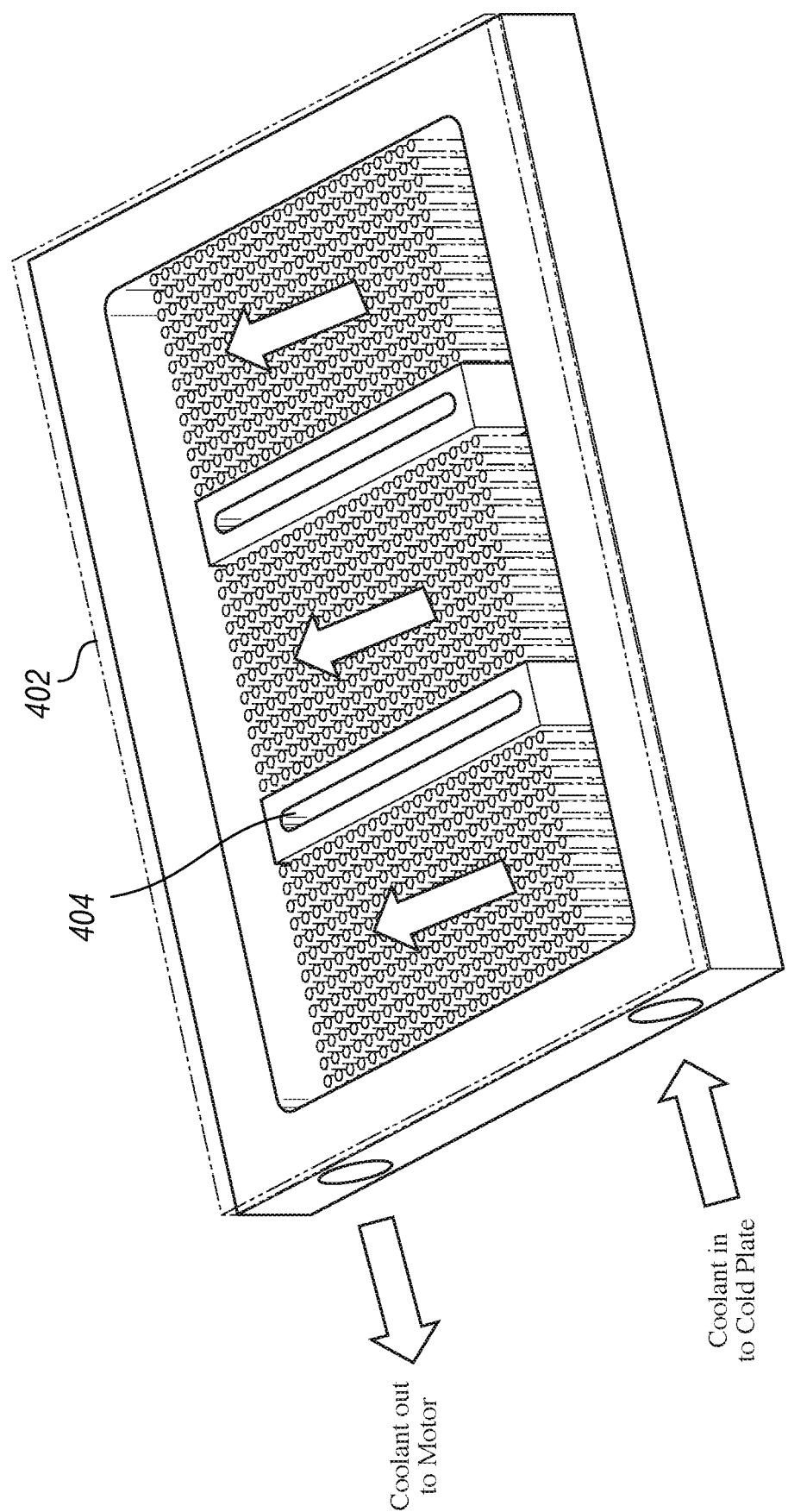
FIG. 4 shows aspects of an example cold plate.

FIG. 4 shows aspects of another example of a cold plate. The cold plate of FIG. 4 is shown assembled with the cover 402 (shown transparent in the figure) and shows the heat transfer pins in the coolant channels. The arrows in the figure show the general coolant flow direction in the example cold plate. The coolant enters the cold plate, flows through the cold plate through the cooling pins, and exits the cold plate where the coolant can be further routed to other components that may require temperature control such as a motor. In this example, the conductor passage 404 are shown as slots. The slots may be insulated and may allow one or more conductor bars to pass through the cold plate.

Figure 5:
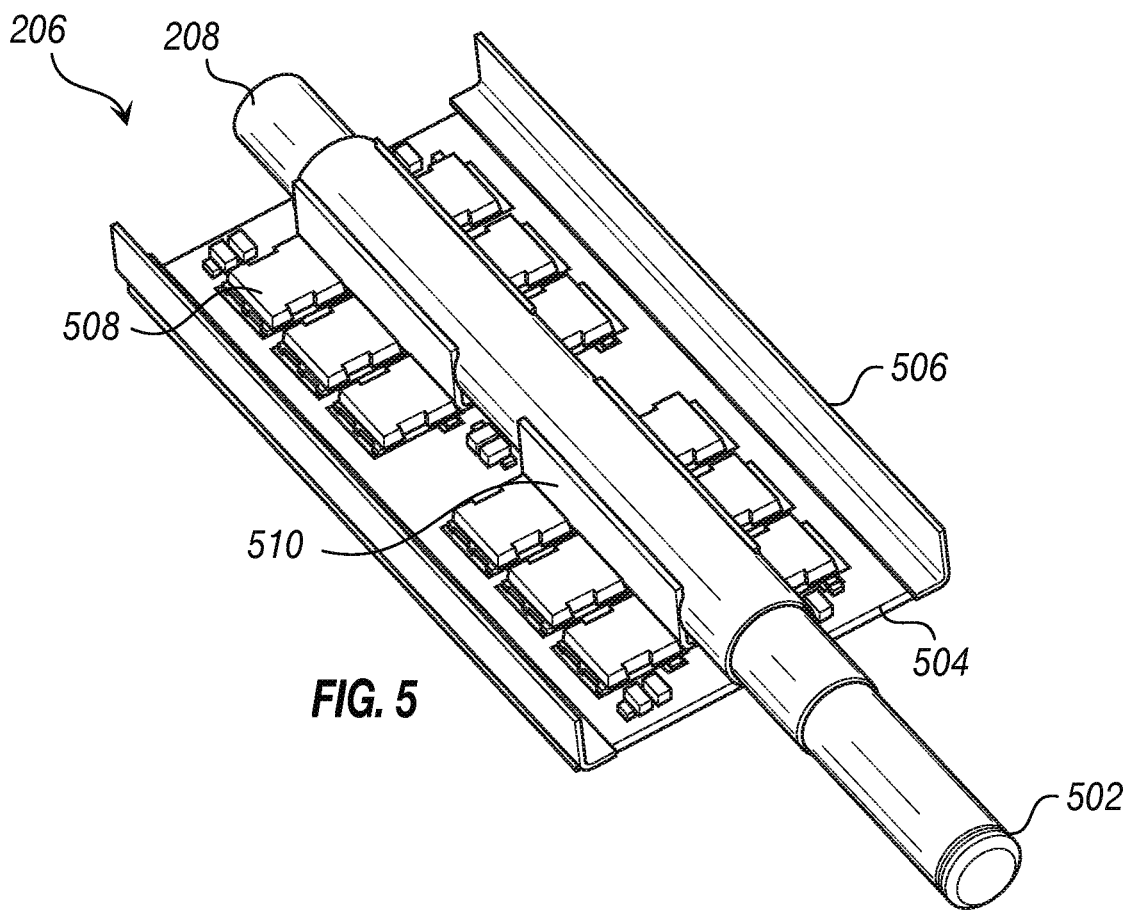
FIG. 5 shows aspects of an example IMS board.

Aspects of an example IMS board 206 are shown in FIG. 5. The board may include a printed circuit board (PCB) 504 that includes one or more solid-state switches 508 and may include other related devices such as capacitors, inductors, and the like. The board 206 may include one or more bus bar channels 510. The bus bar channels 510 may be metal clips that accept a bus bar 208. The bus bar 208 may be held place by the bus bar channels 510. In some embodiments, the bus bar channel 510 may hold the bus bar 208 by a spring force acting on the bus bar from the bus bar channels 510. The bus bar channel may be attached to the board 504 via bolts, soldering, and the like. The IMS board 206 may include brackets 506 on the edges of the board. In embodiments, brackets 506 may be electrical input to the IMS board. In certain embodiments, brackets on each side of the board may be used as DC input wherein one bracket is the positive terminal, and the bracket on the opposite side of the board may be a negative terminal or ground. In embodiments, brackets 506 may be electrical output from the IMS board. In certain embodiments, brackets on each side of the board may be used as DC output wherein one bracket is the positive terminal, and the bracket on the opposite side may be a negative terminal or ground. In certain embodiments, the brackets are copper, and may further include a silver plating. In certain embodiments, the bus bars are copper, and may further include silver plating. In certain embodiments, the bus bar channels that hold and electrically couple the bus bars are copper, and may further include silver plating. The example bus bar 208 may have a configured end 502, such as through machining, to be compatible with the planned connector. The configured end 502 may be machined or formed to include one or more features such as grooves, chamfers, notches, and the like to accept a connector which may use the features to lock or snap onto the bus bar for attachment. The configured end 502 may be long enough to pass through the housing of the MDC.

Figure 6:
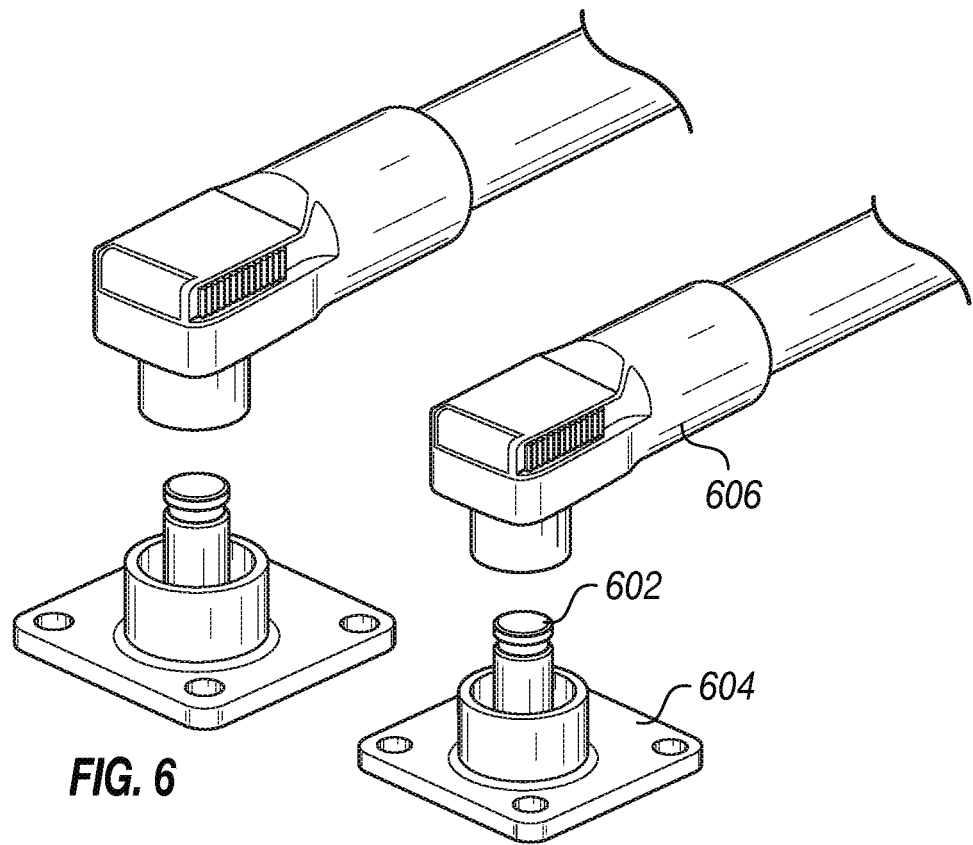
FIG. 6 shows aspects of example connectors.

FIG. 6 shows aspects of the connector features associated with the bus bar. The configured end of the bus bar 602 may pass through the housing of the MDC via a sealing bracket 604 that may provide an environmental seal and/or electrical insulation around the bus bar. The configured end 602 of the bus bar may act as the male part of a connector such as a RadLok cable connections and may allow a female part of the connector 606 to attach directly to the bus bar.

Figure 7:
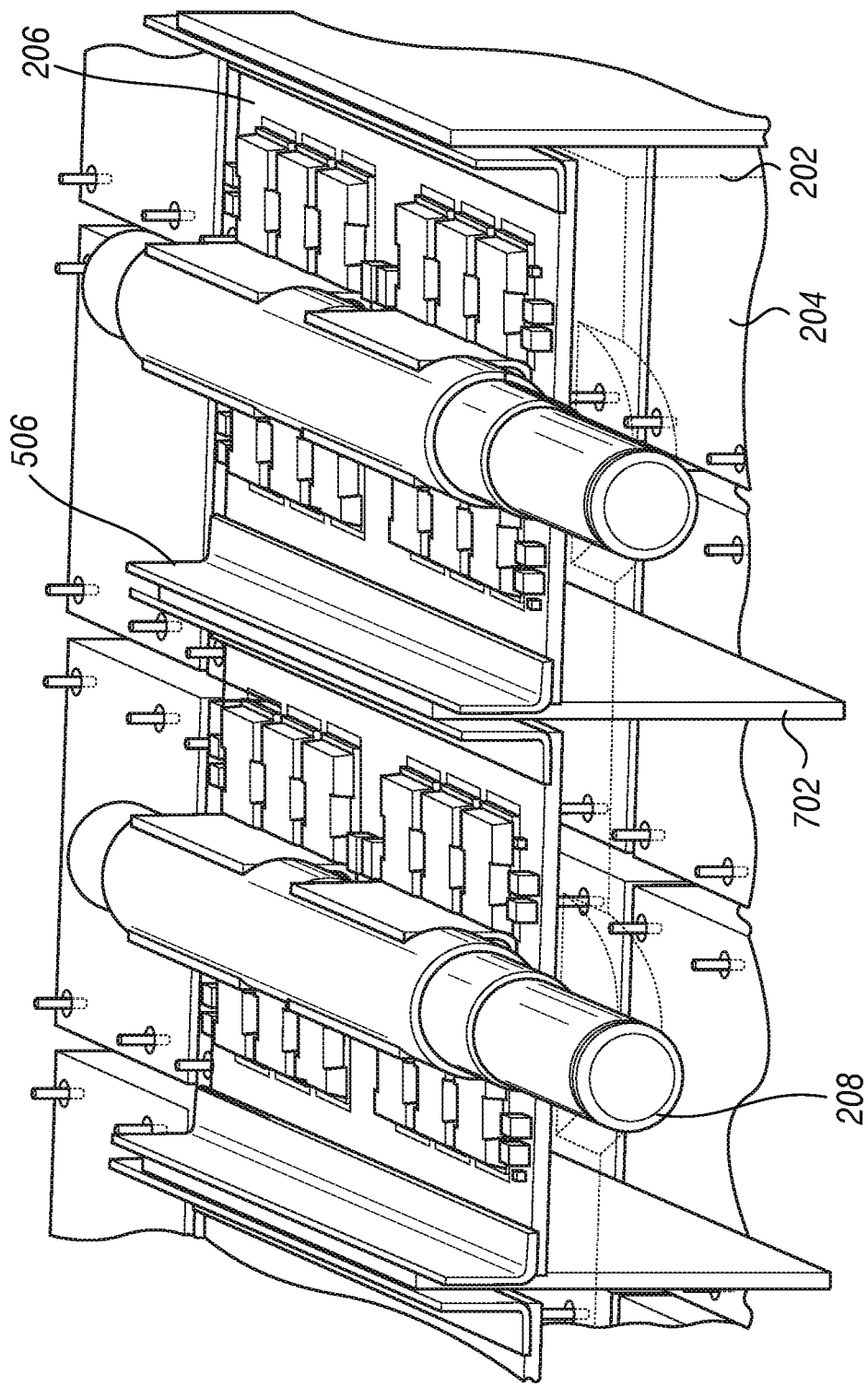
FIG. 7 shows example connection details for an MDC.

Referencing FIG. 7, example connection details for an MDC of the present disclosure are depicted. The example includes shows a section of the MDC that includes two IMS boards 206 positioned next to each other. The boards 206 are positioned on one side a cold plate 202 (shown as a transparent box) with the link capacitors 204 positioned on the opposite of the cold plate 202. The IMS boards 206 may be arranged so that the edges of the boards that include brackets 506 are parallel to one another. The example FIG. 7 shows a conductor 702 that electrically couples the link capacitors 204 and the IMS boards 206. The conductor 702, shown as a bar in the example, may pass through the cold plate 202 via one or more conductor passages (not shown) in the cold plate 202. In embodiments, the conductor 702 may be one or more wires, bars, plates, and the like. The conductor 702 may be connected to the brackets 506 of adjacent IMS boards 206. The conductor 702 may carry direct current (DC) from the link capacitors 204 to the IMS boards 206. In this configuration, the conductor is short as it passes through the cold plate and does not require routing around the cold plate. In certain embodiments, the DC conductor is a high current coupling, for example, based on the desired power throughput of the MDC and the available DC voltage (48V, for example).

The conductor 702 may be bolted or clamped to the brackets 506, allowing for some compliance movement during installation and operations. Providing some compliance to the motor phase bus bars 208 allows for make-up of tolerance stack-ups for parts during installation, better sealing performance, allowing for relief positioning of components without loading, and improved uniformity of connection for the current-carrying components (e.g., avoiding hot-spots, unplanned load distribution, etc.). In embodiments, the conductor 702 may further provide a structural connection between one or more of the link capacitors 204, cold plate 202, and the IMS boards 206. The conductor 702 may be configured to provide a downward pressure to the IMS boards 206, thereby causing contact between the boards 206 and the cold plate 202.

Figure 8:
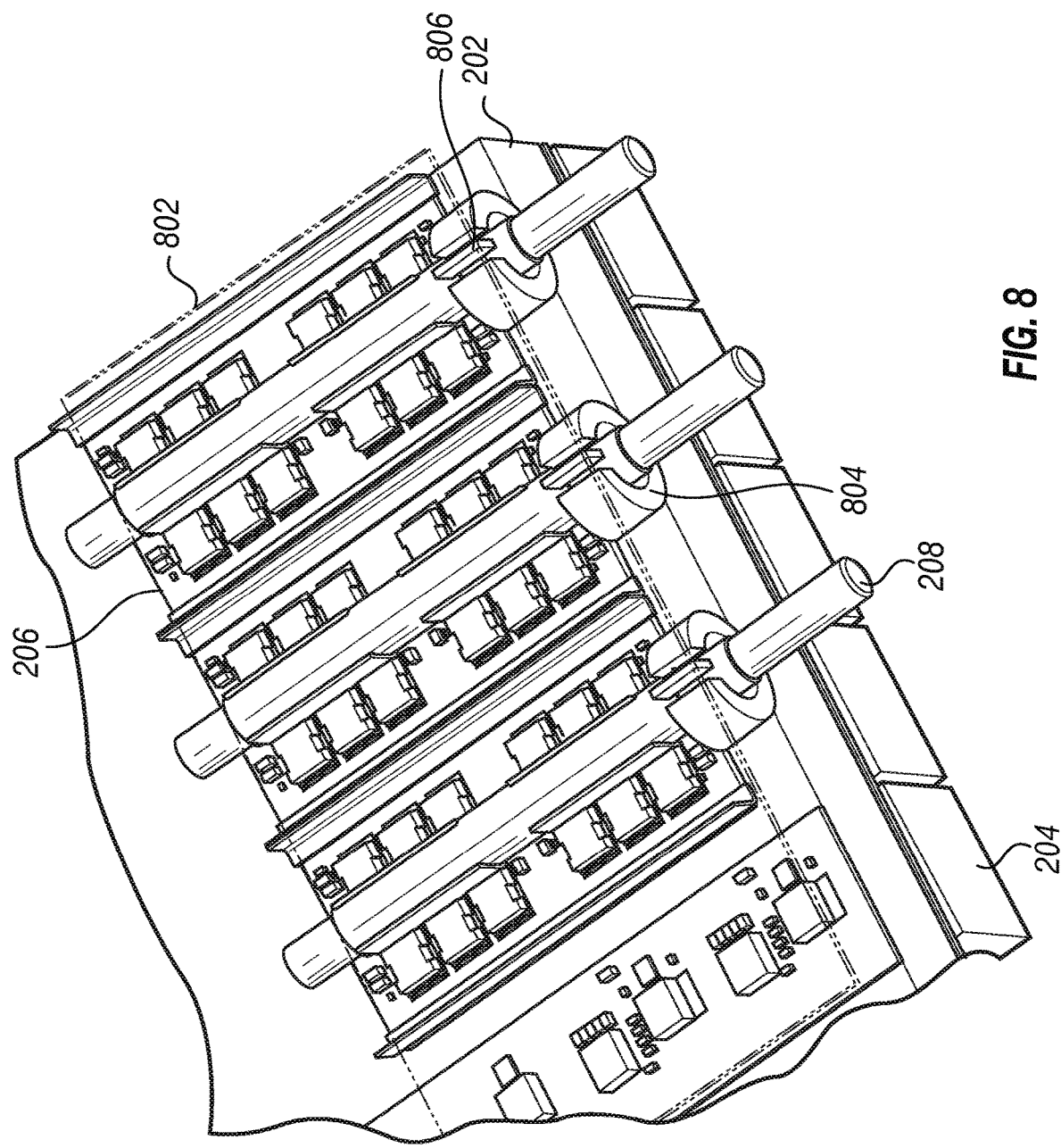
FIG. 8 shows aspects of some details for an MDC.

Referencing FIG. 8, additional details of an example MDC is depicted having a number of features of the present disclosure. The example MDC includes IMS boards 206 and link capacitor array 204 on opposite sides of a cold plate 202. The example MDC includes a current sensor (ferrite core 804 and hall effect sensor 806) on each bus bar 208 for each phase. The MDC may further include a control board 802 (shown as a transparent box), which may be positioned on top of the IMS boards 206 and may provide mounting points and/or electrical connections to the ferrite core 804 and/or the hall effect sensor 806.

Figure 9:
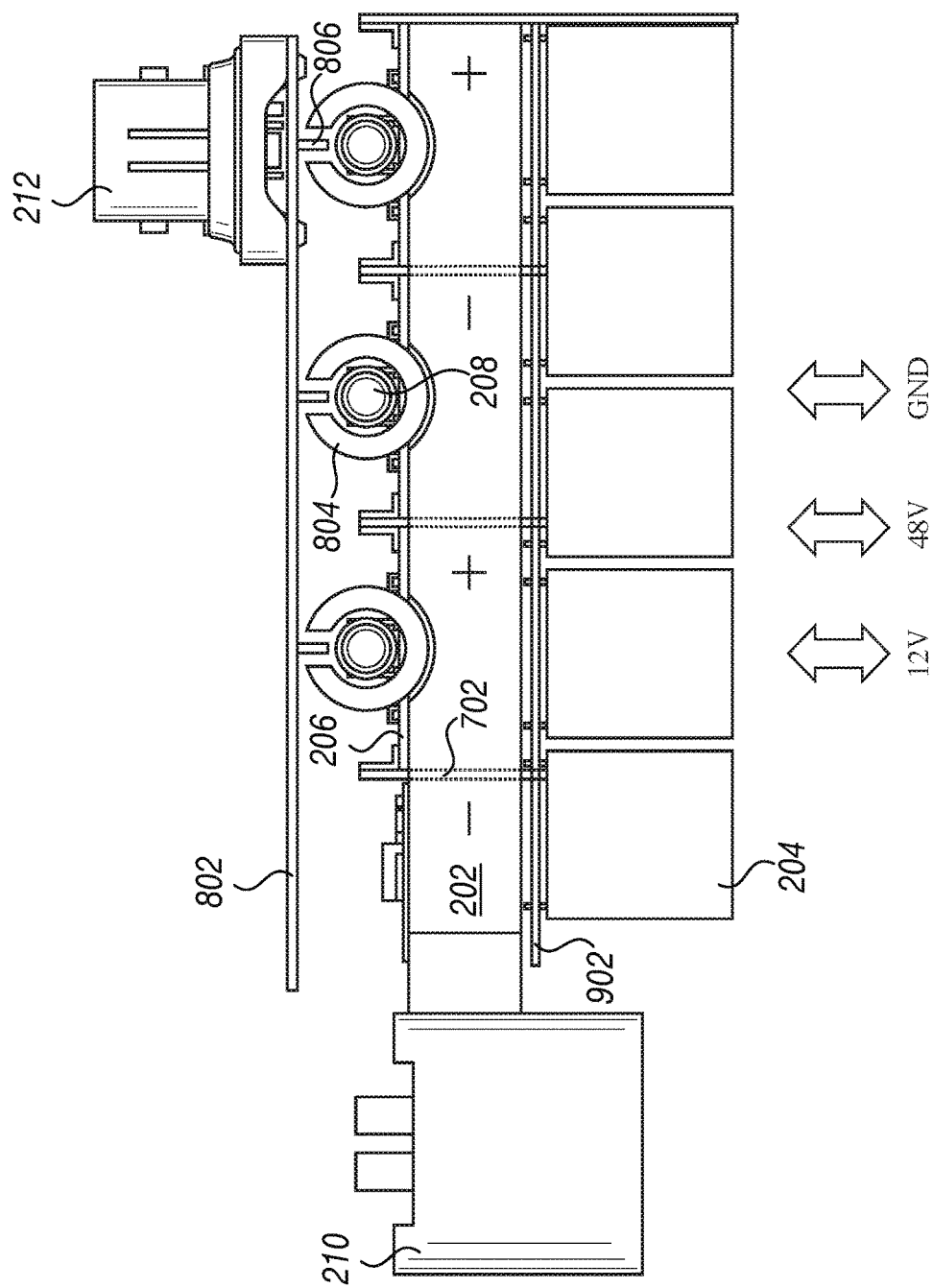
FIG. 9 shows a side view of an example MDC.

Referencing FIG. 9, a side view of the MDC is depicted with example electrical flow paths. The example of FIG. 9 shows a cold plate 202 with link capacitors 204 on the bottom side of the cold plate and three IMS boards on top of the cold plate. A control board 802 may be positioned above the IMS boards 206. The control board 802 may include additional components such as connectors 212 and control circuitry (not shown). Inductors 210 may be positioned on the side of the cold plate 202. The link capacitor array 204 may include a carrier 902, such as a printed circuit board or a formed conductor that provides electrical connections between the capacitors of the link capacitor array 204. The example includes a mobile application having a 12V DC system and a 48V DC system, such as for general vehicle power (e.g., key switch, lights, etc.) on the 12V side and for motive interaction power (e.g., through a PTO device or other light/mild hybrid device) on the 48V side. The described voltages are examples only, and may further be nominal voltages only. In the example, the 48V DC power passes through conductors 702 from the 48V DC power to the inverter circuits on the IMS boards 206. The conductors 702 may be plate conductors and may provide for uniform current flow, configurations with compliance (e.g., plate flexing), and provides for embodiments where the current flow passes through slots in the cold plate 202, allowing close proximity of the cold plate to both the inverter components and the DC high current flow path. In certain embodiments, the orientation of each adjacent inverter phase is in a flipped arrangement—for example, +/−: −/+: +/− for a 3-phase inverter. The flipped arrangement allows for adjacent inverter phases to share DC conduction paths, reducing the number of current flow paths that must be provided, allowing for larger (and therefore more uniform relative to tolerances) flow paths to be utilized, and providing for improved compliance of the DC conduction paths (e.g., individual plates are more compliant than paired plates that are offset and insulated). Additionally, the flipped arrangement provides for a reduced number of parts and a less complex installation (e.g., avoiding insulation paths, testing on insulation capability and wear, etc.).

Figure 10:
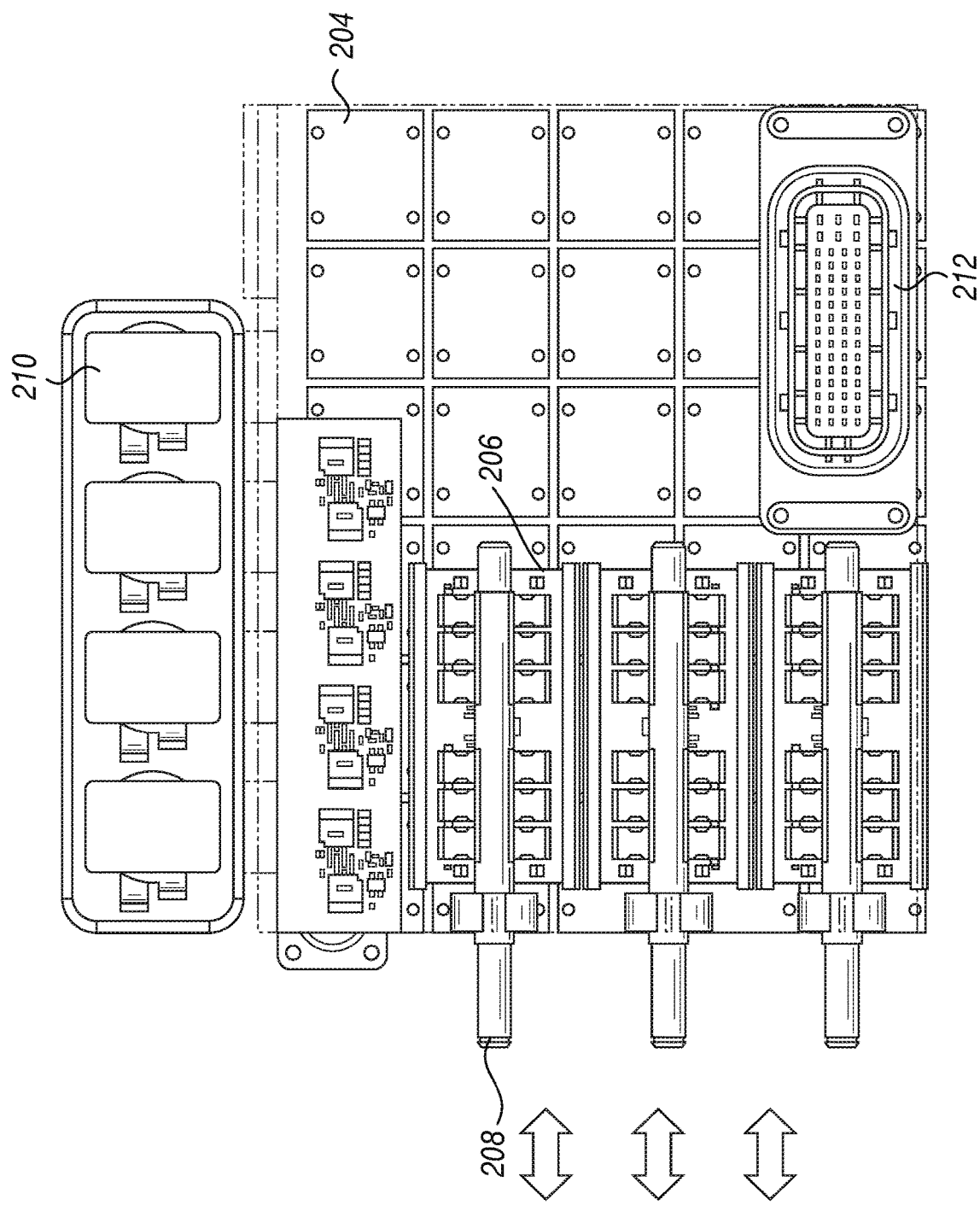
FIG. 10 shows a top view of an example MDC.

Referencing FIG. 10, a top view of the MDC is depicted with example electrical flow paths. The example of FIG. 10 shows the control board and the cold plate as transparent boxes such that other parts of the MDC can be seen. In embodiments, DC current from the link capacitor array 204 may be transformed by the IMS boards 206 such that a suitable alternating current (AC) at the outputs of the bus bars 208 may be used to drive an electric motor. The number of bus bards 208 and the number of IMS boards 206 may depend on the number of phases of a motor. To drive a three-phase motor, three boards and three bus bards may be used, as shown in FIG. 10. In other embodiments, more or fewer IMS boards and bus bars may be needed based on the number of phases of the driven motor. Similarly, the bus bars 208 may be used to receive AC current from the electric motor, and the devices on the MDC may be used to rectify the AC current to DC current that may be passed to the battery.

Figure 11:
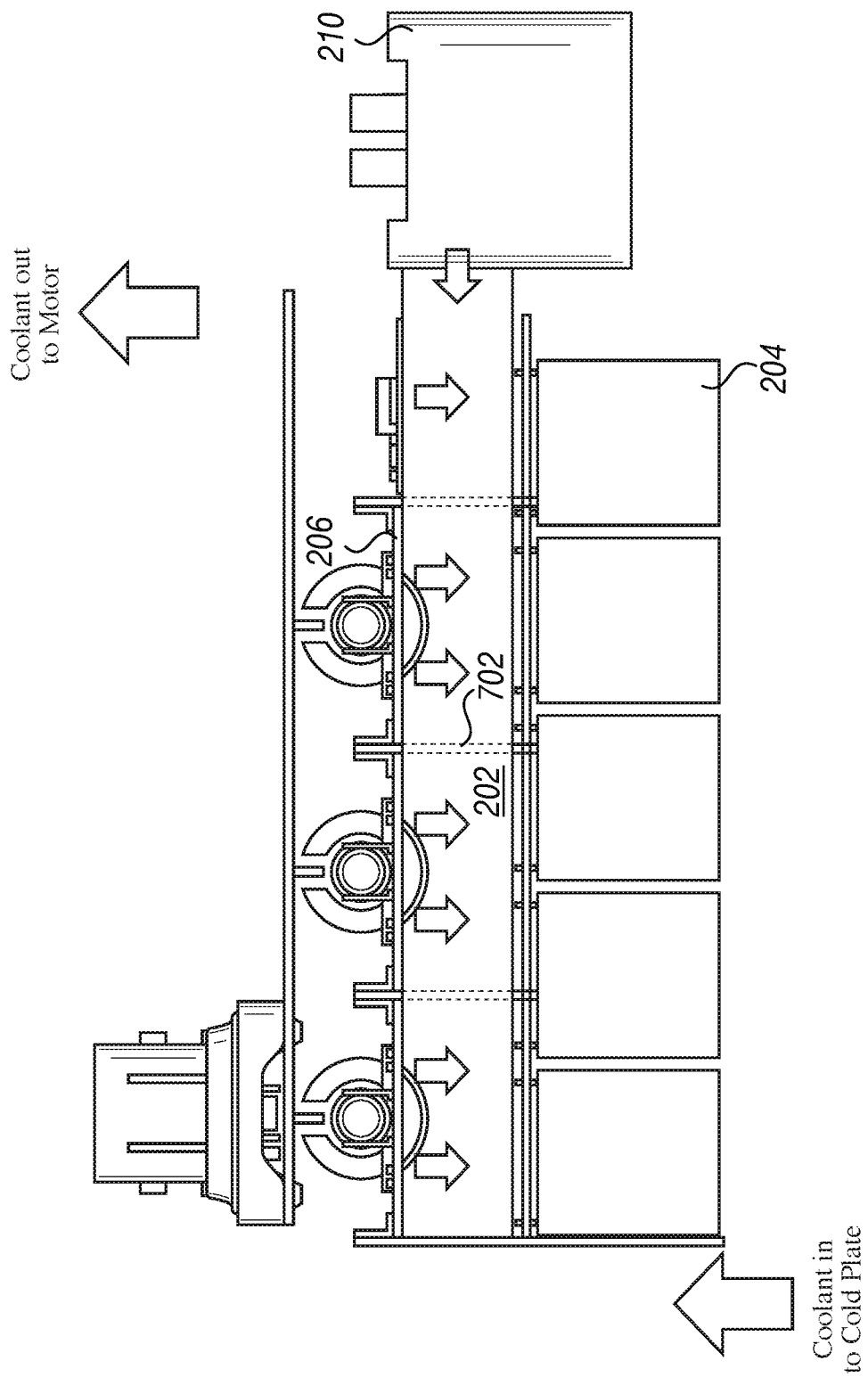
FIG. 11 shows a schematic view of a heat flow path.

Referencing FIG. 11, a schematic diagram of heat flow paths is depicted. In the example, the IMS boards 206 and the cold plate 202 are coupled with thermal grease. The utilization of thermal grease allows for slight movement of the board relative to the cold plate while maintaining uniform coupling over the area of the board. In the example of FIG. 11, the capacitors array 204 is provided on the opposite side of the cold plate 206 away from the inverter MOSFETs on the IMS boards 206. The inductors 210 are coupled to the cold plate on one side of the cold plate 202. In the example of FIG. 11, coolant from the vehicle or other source is provided to the cold plate 202, and coolant leaving the cold plate is provided to the motor, allowing for the entire MDC-motor system to have a single coolant inlet and outlet to the vehicle, and ensuring that the cooling balance between the MDC and the motor is controllable by the subsystem having the MDC-motor, rather than relying on the separate conditions that would be provided to the motor or MDC from the vehicle or other subsystems in a two-inlet arrangement.

The example of FIG. 11 depicts a cold plate 202 having slots therethrough for the DC conduction path to pass through the cold plate via one or more conductors 702, coupling the capacitors and DC power source to the MOSFET board, and flow channels for each of the MOSFET phase blocks. The cold plate includes flow-control and/or heat transfer features—pins 308 within the flow channels in the example of FIG. 3—that are configured to provide sufficient heat transfer between the coolant and each MOSFET phase, and between the coolant and each DC conduction path. In the example of FIG. 11, the main flow channels, before entry into the flow channels for each MOSFET phase, are free-flowing and provide for minimal pressure drop in the coolant flow away from the coolant channels for each MOSFET phase, promoting uniform flow across the cold plate.

Figure 12:
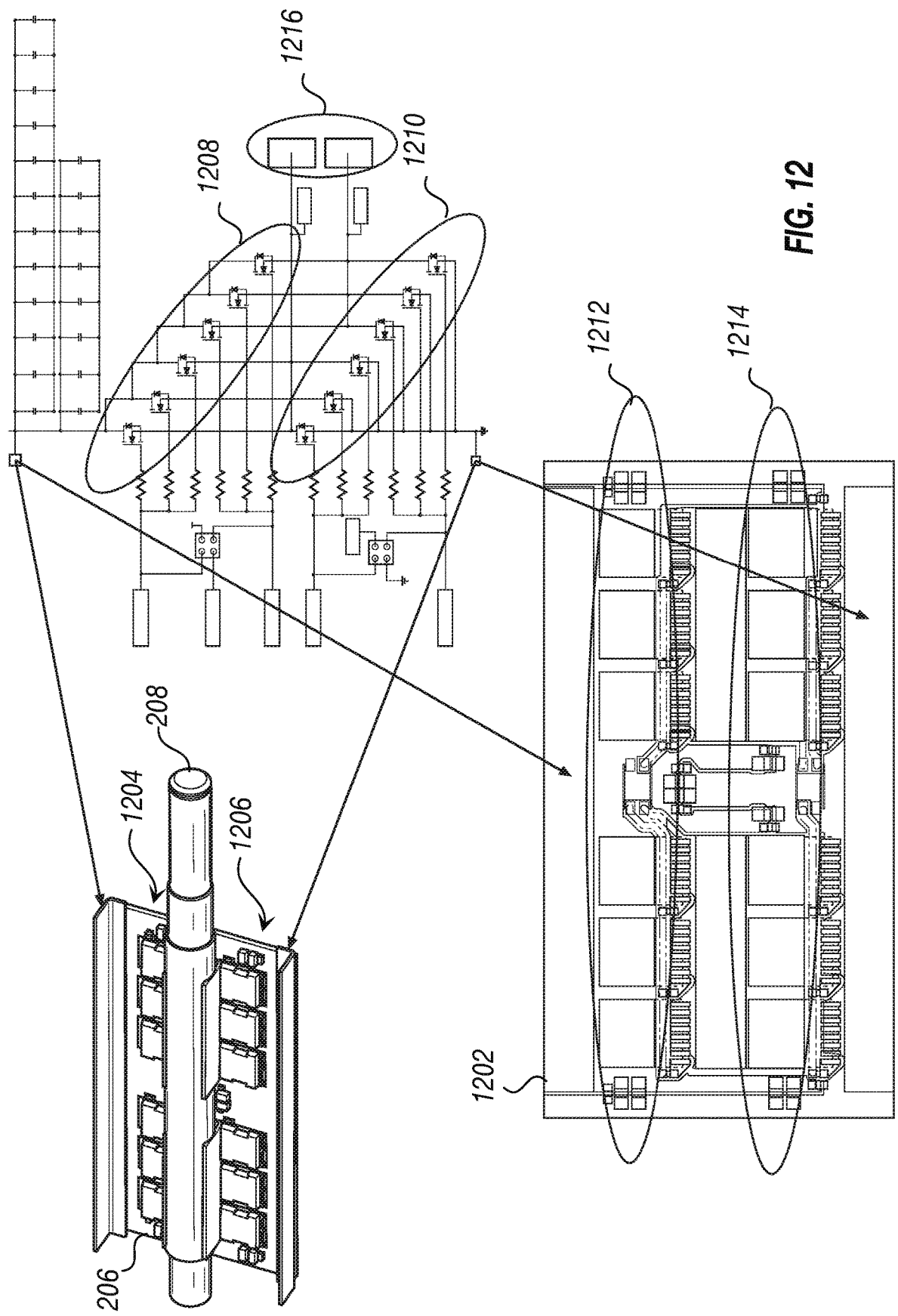
FIG. 12 shows a view of an example board.

FIG. 12 depicts a view of a single IMS board 206 (MOSFET phase block, with a motor bus bar 208 coupled thereto). An example circuit diagram is depicted in relation to the phase card and an example board layout 1202. The arrows in the figure show correspondence between the terminals of the board 206, the circuit diagram, and the board layout 1202. The end of the bus bar 208 corresponds to the outputs 1216 of the circuit diagram. The switching devices 1208 of the circuit diagram corresponding to area 1212 of the board layout, which is the top area 1204 of the board 206. The switching devices 1210 of the circuit diagram corresponding to the area 1214 of the board layout, which is the bottom area 1206 of the board 206. The board 206 may be coupled to the cold plate with thermal grease, allowing for slight movement of the phase card relative to the cold plate. The phase card may additionally or alternatively be coupled to the cold plate with a clamp, selected biasing force, or the like.

Figure 13:
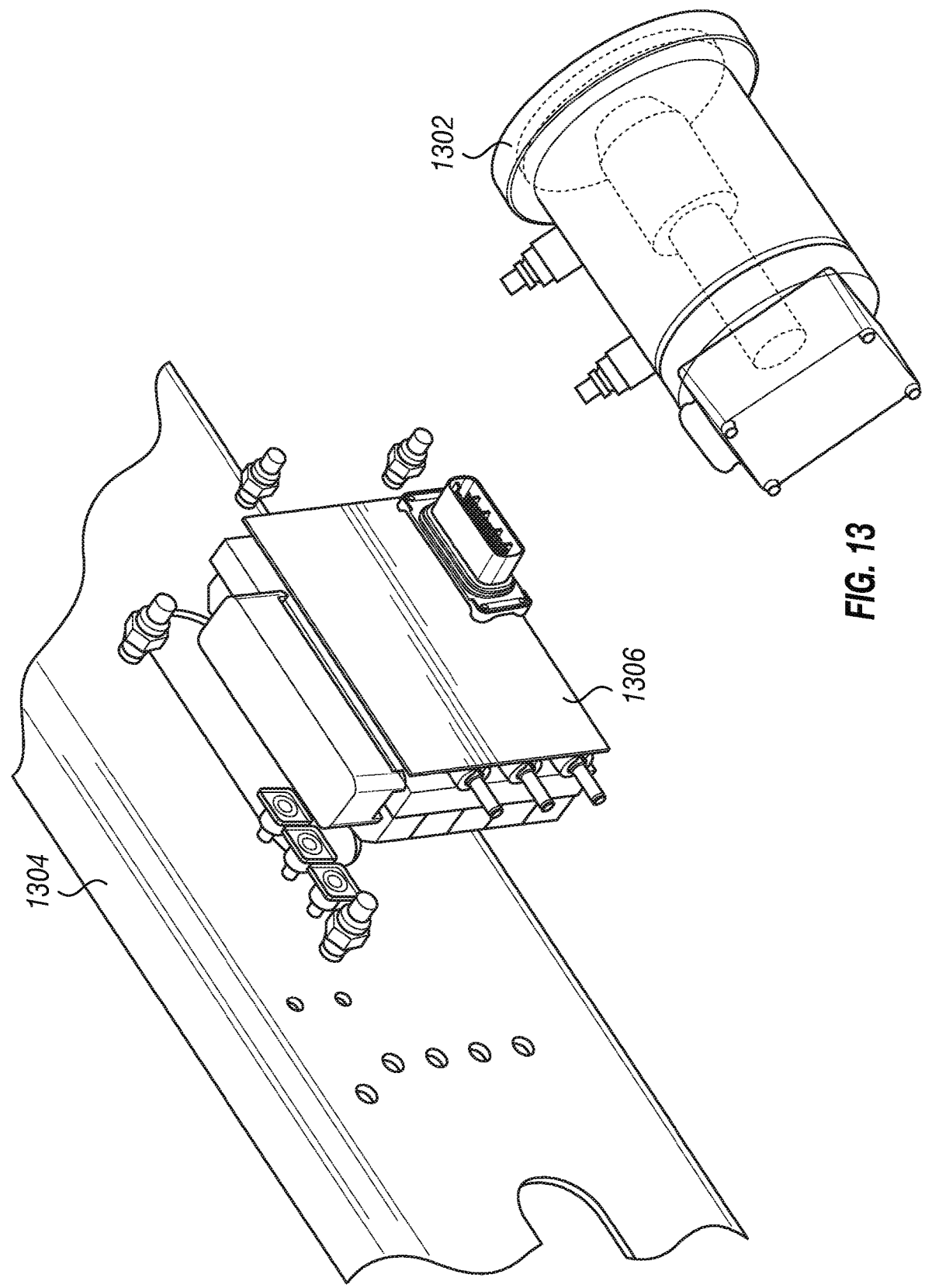
FIG. 13 shows coolant flow arrangements for an example MDC.

Referencing FIG. 13, coolant flow arrangements for an example MDC 1306 and motor 1032 are schematically depicted. In the example, coolant is introduced to the MDC/motor subsystem from outside a vehicle frame rail 1304, pass through the cold plate to exchange heat with the phase cards or IMS board, DC conductors, and/or other MDC components, and then the coolant passes to the motor 1302 (or motor/generator). The example of FIG. 13 then returns the coolant to the vehicle coolant system (or other sources), through the MDC housing, and back to outside of the frame rail 1304. The example of FIG. 13 allows for coolant flow and/or temperature to be determined at each flow connection or in each flow path, thereby allowing for separate determination of heat transfer with the MDC or MDC components, and for the motor. Accordingly, the MDC 1306 and motor 1302 can be diagnosed separately, and the system can be configured to ensure each of the MDC and the motor receive adequate cooling. In the example of FIG. 13, a single coolant interface (inlet and outlet) is provided to the vehicle cooling system, whether at the frame rail 1304, as depicted in FIG. 13 or in another location. In certain embodiments, coolant may flow to the MDC first or to the motor first. In certain embodiments, coolant may have an inlet to a first one of the MDC or motor, and an outlet from the second one of the MDC or the motor. In certain embodiments, such as that depicted in FIG. 13, where a single component (the MDC, in the example) provides both the inlet and outlet from the vehicle coolant system, the spacing and other aspects of the interface are defined, allowing for simpler integration of the MDC/motor system into various applications.

Figure 14:
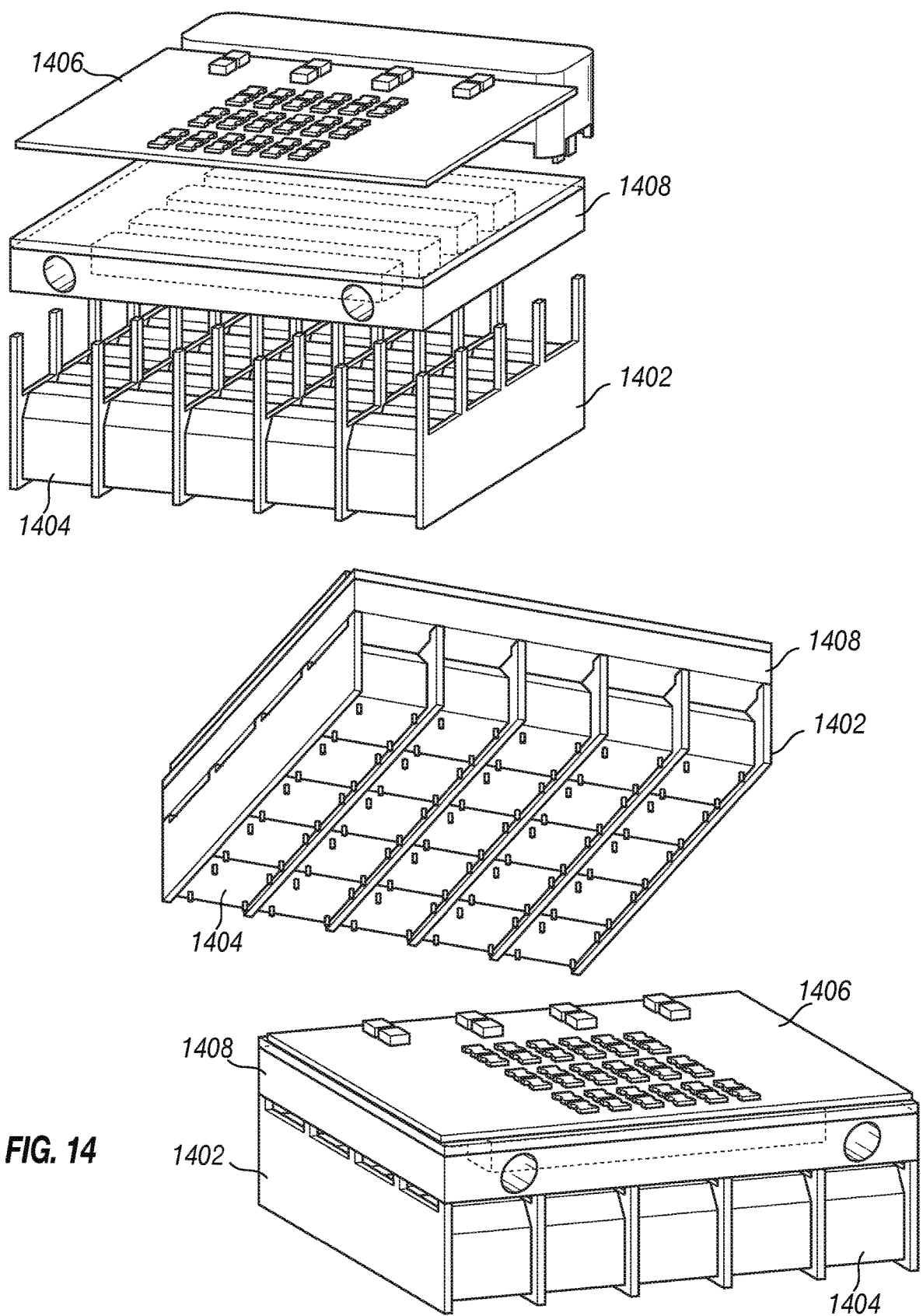
FIG. 14 shows views of an example electronics packaging of an MDC.

Referencing FIG. 14, different view of an example electronics packaging system is depicted. The example includes the capacitors 1404 provided on an opposing side of the cold plate 1408, the cold plate configured for liquid cooling, the DC conductors 1402 (DC bus conductors) passing through the cold plate 1408, and an insulated metallic substrate 1406 for the power electronics (e.g., the MOSFET blocks). Any dimensions or values provided in FIG. 14, or throughout the present disclosure, are non-limiting examples provided for illustration.

Figure 15:
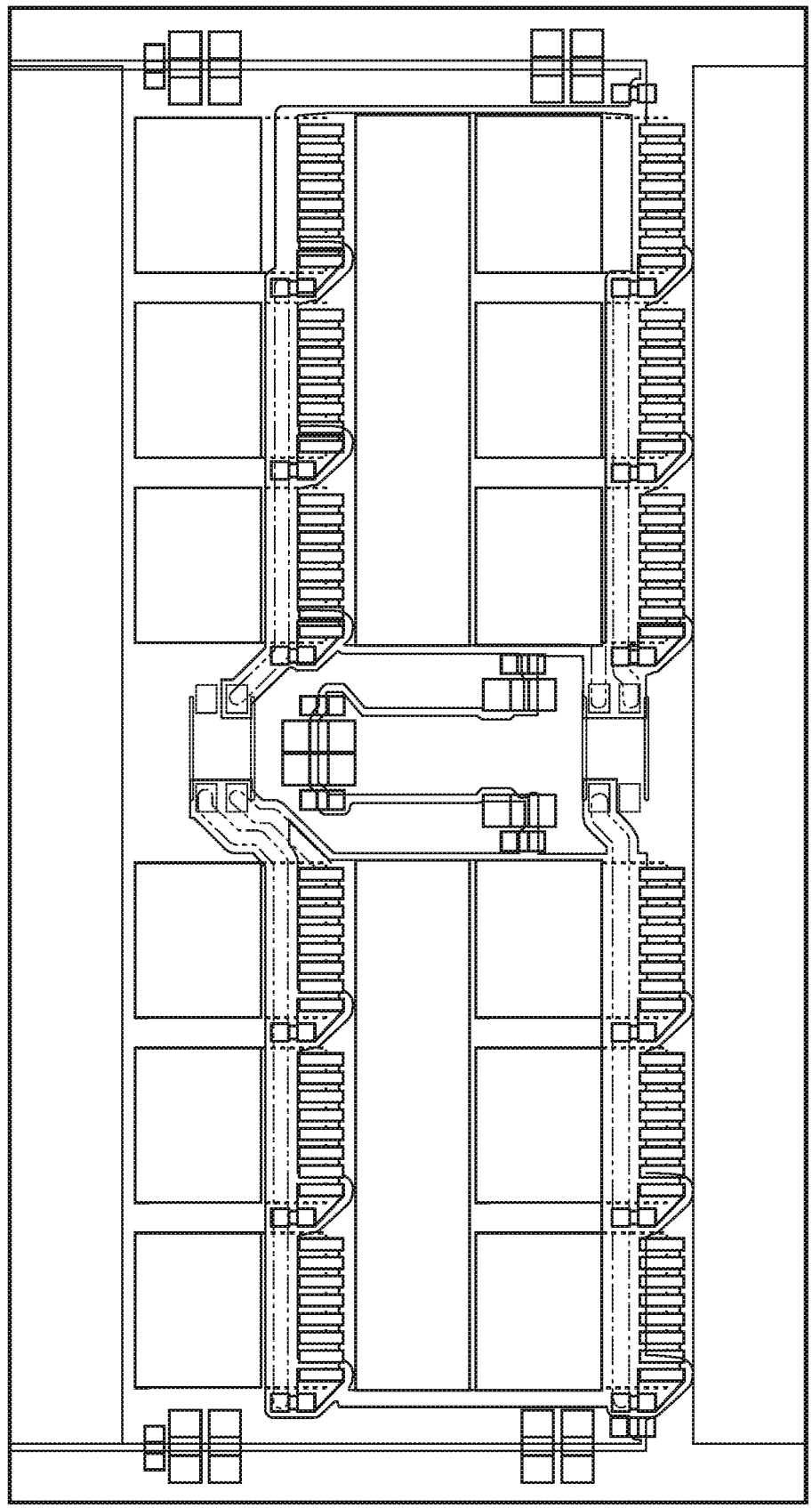
FIG. 15 shows a schematic view of an example card.
Figure 16:
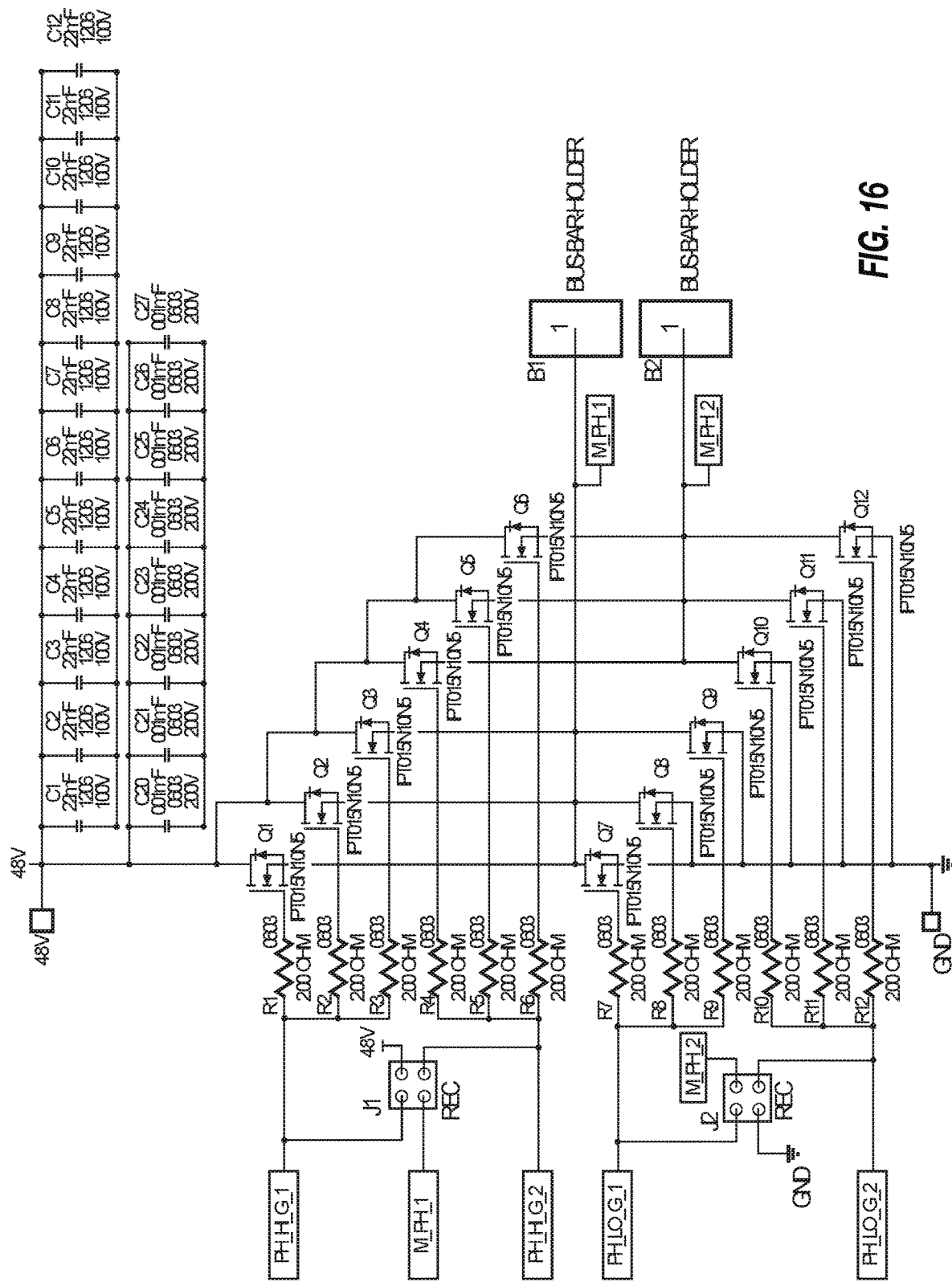
FIG. 16 shows a schematic view of an example circuit.
Figure 17:
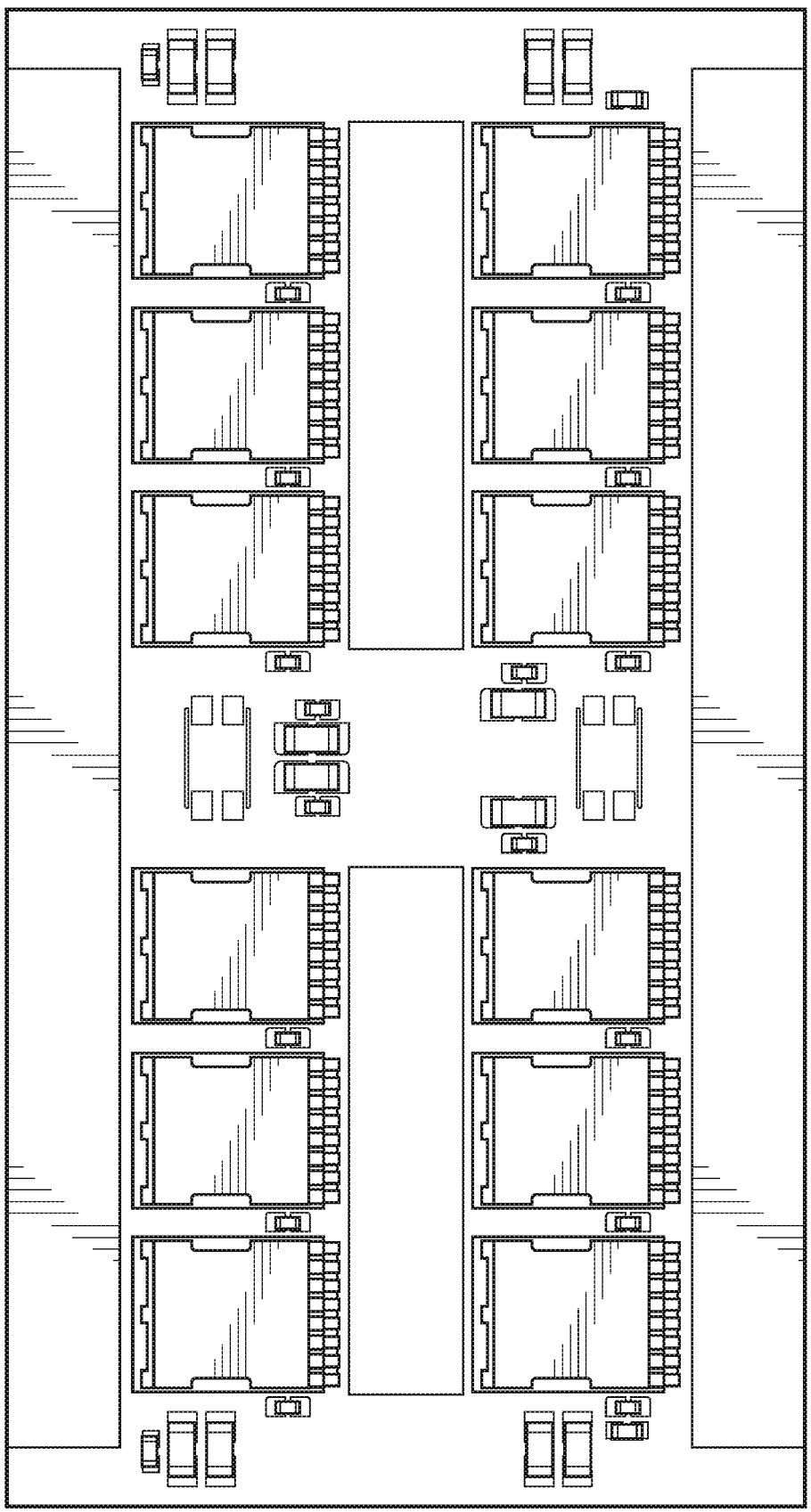
FIG. 17 shows a view of an example card.
Figure 18:
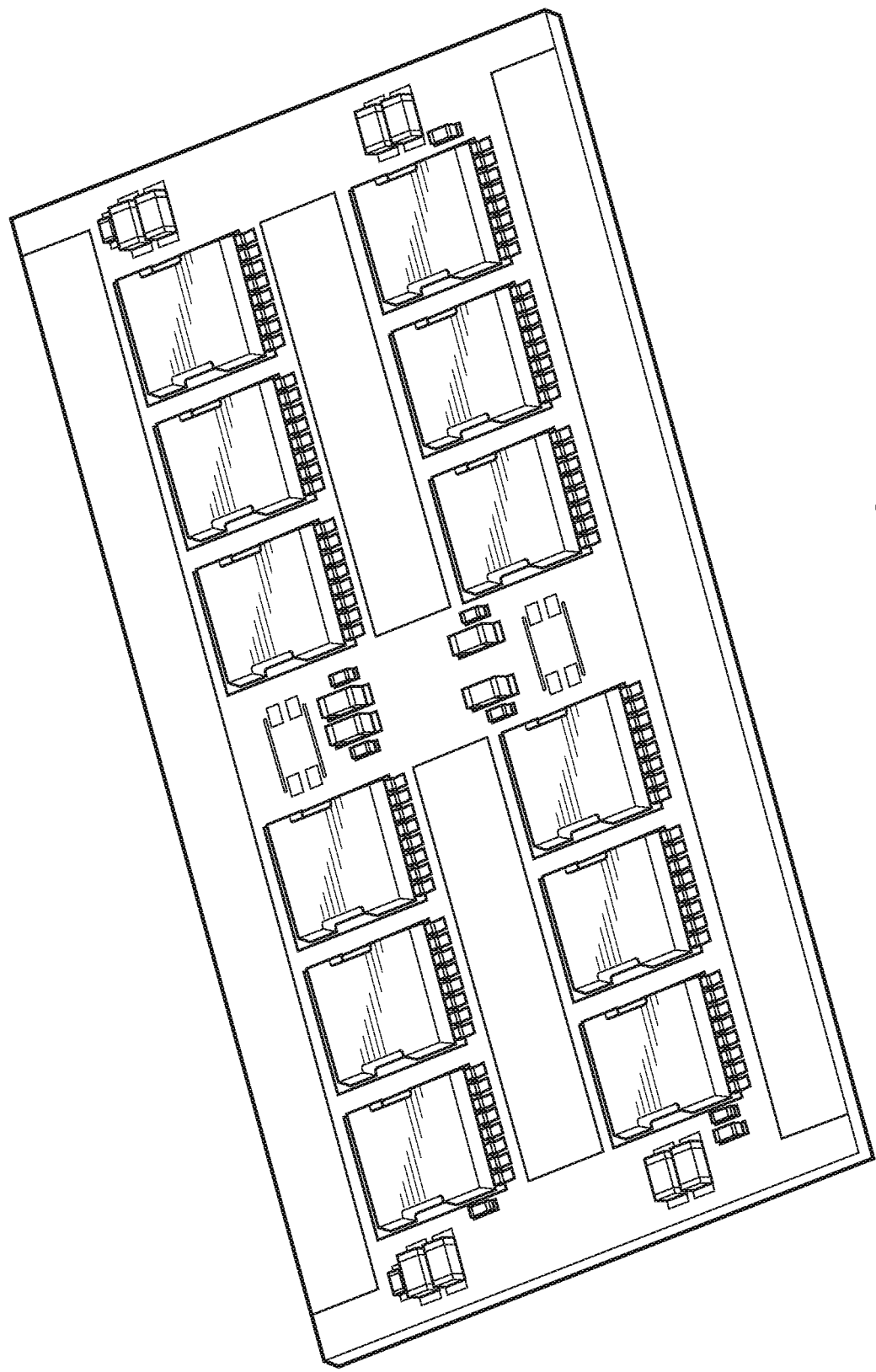
FIG. 18 shows a view of an example card.

Referencing FIG. 15, a detailed schematic view of an example phase card is depicted. The example phase card is configured for a 48V DC system for powering the mild/light hybrid aspect of the system. In the example of FIG. 15, it can be seen that reduced lengths between the gate drivers (ceramic couplers) are provided—for example, where no FET is positioned more than 1.5 transistors away from a corresponding ceramic coupler. In certain embodiments, a system such as that depicted in FIG. 15 provides for higher transient and frequency capability, by reducing noise, ringing, inductance, and/or other artifacts on the gate driver. Referencing FIG. 16, a schematic illustration of the example circuit diagram depicted in FIG. 12 is shown in a larger view. Referencing FIGS. 17 and 18, additional views of an example phase card are depicted.

Figure 19:
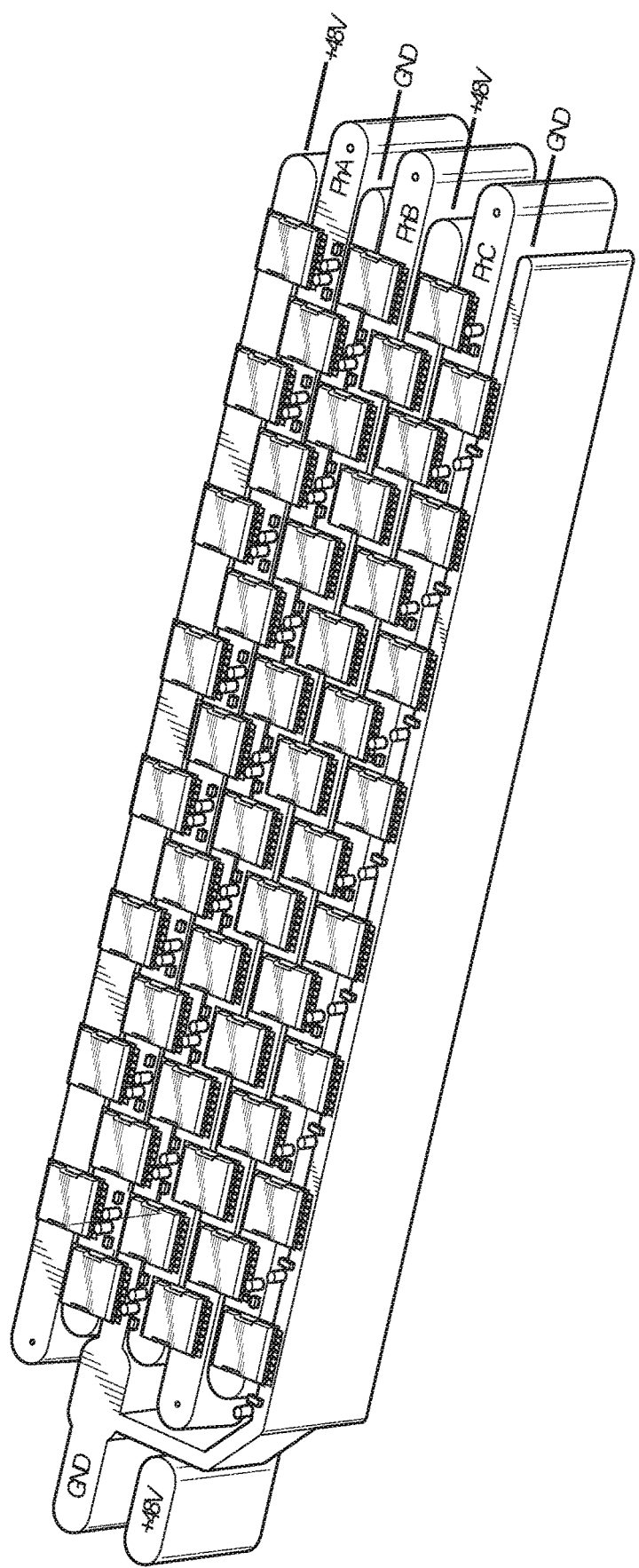
FIGS. 19-21 show views of an example power bus arrangement.
Figure 20:
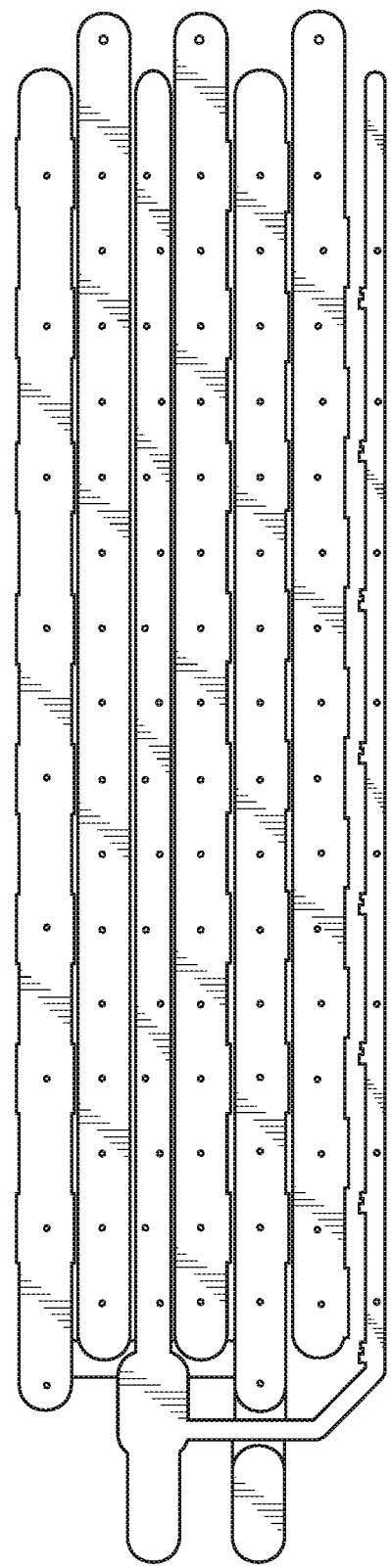

Referencing FIG. 19, an example arrangement of AC and DC power buses is depicted, with the DC power coupling on the left side, and with each phase of the AC depicted at the right side. The arrangement of FIG. 19 allows for robust thermal coupling of the heat source portions of the MDC with the cold plate. Referencing FIG. 20, the example arrangement of FIG. 19 is depicted with the MOSFETs removed to illustrate aspects of the power bus arrangements.

Figure 21:
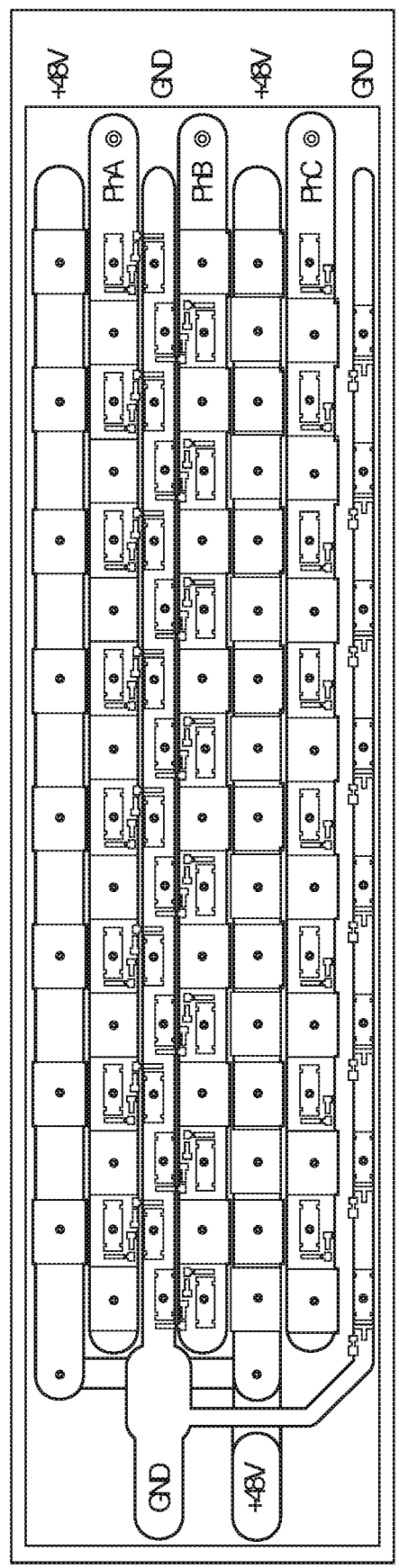

Referencing FIG. 21, the example arrangement of FIG. 19 is depicted with annotations on the MOSFETs, showing an example configuration to support a 48V DC coupling, and a three-phase AC coupling.

Figure 22:
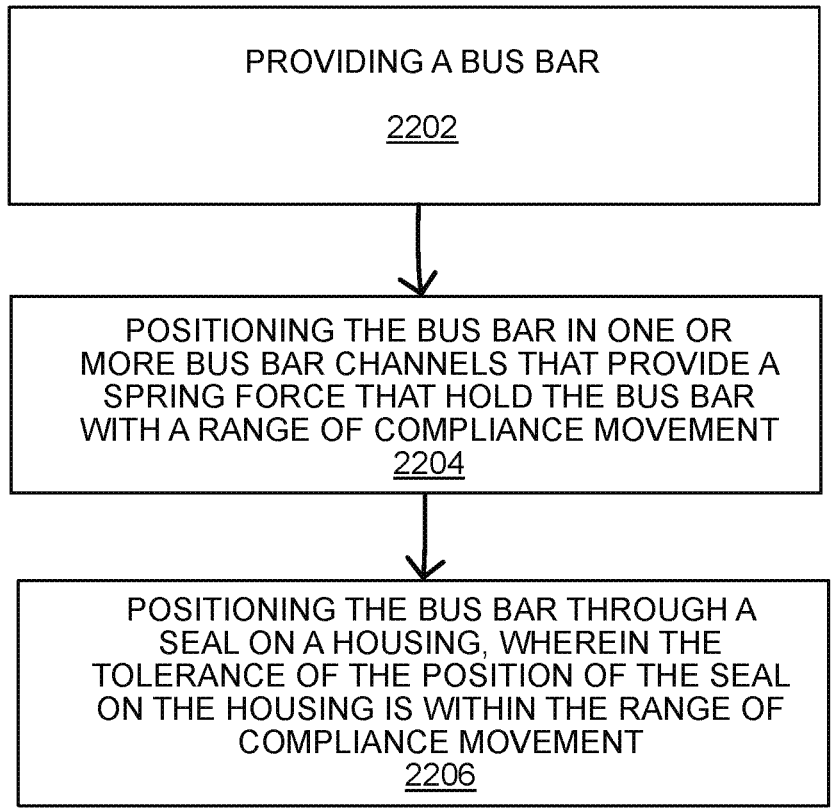
FIG. 22 shows a method for the MDC.

Referencing FIG. 22, an example method for the MDC shows example steps. The method may include steps for assembly of a compliant motor drive converter. The method may include providing a bus bar with a shaped end configured to accept a connector (STEP 2202). The bus bar may be positioned in one or more bus bar channels that provide a spring force that hold the bus bar to a driver card and provides a range of compliance movement (STEP 2204). The bust bar may further be positioned through a seal on a housing, wherein a tolerance of the position of the seal on the housing may be within the range of compliance movement associated with the bus bar channels (STEP 2206). In embodiments, the compliance provided to the bus bar may allow the seal around the bus bar to provide a complete seal around the bus bar and provide a seal from the elements of the MDC.

Examples of the present disclosure are capable of being packaged inside a frame rail of a vehicle. Examples of the present disclosure include a coolant sensor positioned away from the motor. Examples of the present disclosure include AC phase bus bars doubling as connector pins for the MDC. Examples of the present disclosure include providing overall system compliance and sealing by balancing compliance of AC phase bus bar movement relative to a phase card, phase card movement relative to a cold plate, and/or compliance of DC conductor plates (or foils, combs, etc.). Examples of the present disclosure provide for increased space available above the MOSFETs, allowing for closer positioning of controllers and/or drivers to the MOSFETs, thereby reducing conduction/communication path lengths and/or allowing for a smaller footprint of the MDC.

An example system includes a PTO system having an electric motor/generator and a power transfer element coupled to a driveline of a vehicle (e.g., to a transmission at a PTO interface, or other power transfer coupling to the driveline). The example power transfer element selectively transfers torque from the electric motor/generator to the driveline, or from the driveline to the electric motor/generator, based on a mode of the power transfer element. The system includes a motor drive converter that transfers electric power to the electric motor/generator or receives power from the electric motor/generator based on the mode and/or other considerations (e.g., SOC for a battery pack, or other considerations). The motor drive converter includes a cold plate having a first side and a second side, with the first side thermally coupled to motor phase power electronics (e.g., one to three phases, or a different number of phases), and a capacitor array thermally coupled to the second side of the cold plate. The example cold plate includes slots therethrough, where a conductor passes through the cold plate, and the conductor electrically couples the capacitor array to the motor phase power electronics.

Certain further aspects of the example system are described following, any one or more of which may be present in certain embodiments. An example system includes coolant flow channels in the cold plate for a liquid coolant, the conductor electrically insulated from the cold plate, and/or the motor phase power electronics having a phase card circuit board thermally coupled to the cold plate. In certain further embodiments, a number of bus bars are electrically coupled to the phase card circuit board(s), where the bus bars include a shaped end configured to accept an external electrical connector. An example system includes the cold plate having a coolant inlet and a coolant outlet, where the coolant outlet is configured for a coolant connection with an electrical motor, e.g., a motor powered by the motor phase power electronics.

An example motor drive converter includes a cold plate having a first side and a second side, the first side opposite the second side. The motor drive converter includes one or more motor phase power electronics disposed on the first side of the cold plate, and a capacitor array disposed on the second side of the cold plate. The cold plate includes slots therethrough for conductor(s) to pass through the cold plate, each conductor configured to electrically couple the capacitor array and the motor phase power electronics.

Certain further aspects of the motor drive converter are described following, any one or more of which may be present in certain embodiments. An example motor drive converter includes a cold plate having coolant flow channels for a liquid coolant, where the cold plate includes flow control and/or heat transfer features, and/or wherein the heat transfer features include pins disposed within the coolant flow channels. An example motor drive converter includes the conductor electrically insulated from the cold plate. An example motor drive converter includes the motor phase power electronics having a phase card circuit(s) thermally coupled to the cold plate, a number of bus bars electrically coupled to the phase card circuit(s), and/or the bus bars having a shaped end configured to accept an external electrical connector. In certain embodiments, each of the bus bars are coupled to the phase board circuit boards with flexible bus bar channels that provide compliance movement between the bus bars and the phase card circuit board(s). An example motor drive converter includes the cold plate having a coolant inlet and a coolant outlet, where the coolant outlet is configured for a coolant connection with an electrical motor (e.g., passing first through the cold plate, then to the electrical motor). An example motor drive converter is sized to fit within a frame rail of a vehicle. An example phase card circuit(s) includes solid state switches that drive the bus bars for converting DC from the capacitor array to AC for driving the electric motor.

An example motor drive converter includes a temperature sensor that monitors coolant temperature at the inlet of the cold plate, a temperature sensor that monitors coolant temperature at an outlet of the cold plate, and at least one coolant flow sensor that monitors a coolant flow through the cold plate. The monitoring of the coolant flow may be performed by receiving a coolant flow value (e.g., from a vehicle controller or the like), and/or that determined the coolant flow value from other system parameters (e.g., a rotational speed of a prime mover, a value determined in accordance with pressure values of the coolant, or the like). In certain embodiments, the coolant temperature and flow values may be utilized to determine heat transfer occurring in the cold plate and/or motor, for example utilizing an energy balance, and/or to determine heat generation of the capacitor array, motor phase power electronics, and/or motor.

An example motor drive converter includes current sensor(s) positioned in electrical proximity to the bus bars, for example as hall effect sensors positioned around each bus bar. In certain embodiments, the conductor passing through the cold plate is structured to provide a force for the motor phase power electronics down toward the cold plate, for example to ensure thermal contact between the motor phase power electronics and the cold plate. In certain embodiments, the conductor passing through the cold plate is structured to provide a force for the capacitor array toward the cold plate.

Certain operations described herein include interpreting, receiving, and/or determining one or more values, parameters, inputs, data, or other information ("receiving data"). Operations to receive data include, without limitation: receiving data via a user input; receiving data over a network of any type; reading a data value from a memory location in communication with the receiving device; utilizing a default value as a received data value; estimating, calculating, or deriving a data value based on other information available to the receiving device; and/or updating any of these in response to a later received data value. In certain embodiments, a data value may be received by a first operation, and later updated by a second operation, as part of the receiving a data value. For example, when communications are down, intermittent, or interrupted, a first receiving operation may be performed, and when communications are restored, an updated receiving operation may be performed.

Certain logical groupings of operations herein, for example, methods or procedures of the current disclosure, are provided to illustrate aspects of the present disclosure. Operations described herein are schematically described and/or depicted, and operations may be combined, divided, re-ordered, added, or removed in a manner consistent with the disclosure herein. It is understood that the context of an operational description may require an ordering for one or more operations, and/or an order for one or more operations may be explicitly disclosed, but the order of operations should be understood broadly, where any equivalent grouping of operations to provide an equivalent outcome of operations is specifically contemplated herein. For example, if a value is used in one operational step, the determining of the value may be required before that operational step in certain contexts (e.g. where the time delay of data for an operation to achieve a certain effect is important), but may not be required before that operation step in other contexts (e.g. where usage of the value from a previous execution cycle of the operations would be sufficient for those purposes). Accordingly, in certain embodiments an order of operations and grouping of operations as described is explicitly contemplated herein, and in certain embodiments re-ordering, subdivision, and/or different grouping of operations is explicitly contemplated herein.

What is claimed is:

1. A motor drive converter comprising:
   a cold plate having a first side and a second side, the first side being opposite to the second side;
   at least one motor phase power electronics disposed on the first side of the cold plate, wherein the at least one motor phase power electronics include at least one phase card circuit board thermally coupled to the cold plate;
   a capacitor array disposed on the second side of the cold plate, wherein the cold plate comprises slots therethrough for a conductor to pass through the cold plate, the conductor configured to electrically couple the capacitor array and the at least one motor phase power electronics; and
   a plurality of bus bars electrically coupled to the at least one phase card circuit board, wherein each of the plurality of bus bars is electrically coupled to the at least one phase card circuit board with flexible bus bar channels configured to provide compliance movement between the plurality of bus bars and the at least one phase card circuit board.

2. The motor drive converter of claim 1, wherein the cold plate comprises coolant flow channels for a liquid coolant.

3. The motor drive converter of claim 2, wherein the cold plate comprises flow control and heat transfer features.

4. The motor drive converter of claim 3, wherein the heat transfer features include pins within the coolant flow channels.

5. The motor drive converter of claim 2, wherein the cold plate comprises a coolant inlet and a coolant outlet, and wherein the coolant outlet is configured for a coolant connection with an electrical motor.

6. The motor drive converter of claim 1, wherein the conductor is electrically insulated from the cold plate.

7. The motor drive converter of claim 1, wherein the plurality of bus bars comprise a shaped end configured to accept an external electrical connector.

8. The motor drive converter of claim 1, wherein the motor drive converter is sized to fit within a frame rail of a vehicle.

9. The motor drive converter of claim 1, wherein the at least one phase card circuit board includes solid state switches that drive the plurality of bus bars for converting direct current from the capacitor array to an alternating current for driving an electric motor.

10. The motor drive converter of claim 1, further comprising at least one current sensor positioned around each of the plurality of bus bars.

11. The motor drive converter of claim 1, wherein the conductor is structured to provide a force toward the cold plate for the at least one motor phase power electronics and/or the capacitor array.

12. A motor drive converter comprising:
    a cold plate having a first side and a second side, the first side being opposite to the second side;
    at least one motor phase power electronics disposed on the first side of the cold plate;
    a capacitor array disposed on the second side of the cold plate;
    wherein the cold plate comprises slots therethrough for a conductor to pass through the cold plate, the conductor configured to electrically couple the capacitor array and the at least one motor phase power electronics, wherein the cold plate comprises coolant flow channels for a liquid coolant;
    at least one first temperature sensor for monitoring coolant temperature at an inlet of the cold plate;
    at least one second temperature sensor for monitoring coolant temperature at an outlet of the cold plate; and
    at least one coolant flow sensor for monitoring coolant flow through the cold plate.

13. The motor drive converter of claim 12, wherein the at least one motor phase power electronics include at least one phase card circuit board thermally coupled to the cold plate.

14. The motor drive converter of claim 13, further comprising a plurality of bus bars electrically coupled to the at least one phase card circuit board.

15. The motor drive converter of claim 14, wherein the plurality of bus bars comprise a shaped end configured to accept an external electrical connector.

16. The motor drive converter of claim 14, wherein each of the plurality of bus bars is electrically coupled to the at least one phase card circuit board with flexible bus bar channels configured to provide compliance movement between the plurality of bus bars and the at least one phase card circuit board.

17. The motor drive converter of claim 14, wherein the motor drive converter is sized to fit within a frame rail of a vehicle.

18. The motor drive converter of claim 14, wherein the at least one phase card circuit board includes solid state switches that drive the plurality of bus bars for converting direct current from the capacitor array to an alternating current for driving an electric motor.

19. The motor drive converter of claim 14, further comprising at least one current sensor positioned around each of the plurality of bus bars.

20. The motor drive converter of claim 12, wherein the cold plate comprises flow control and heat transfer features.

21. The motor drive converter of claim 20, wherein the heat transfer features include pins within the coolant flow channels.

22. The motor drive converter of claim 12, wherein the conductor is electrically insulated from the cold plate.

23. The motor drive converter of claim 12, wherein the cold plate comprises a coolant inlet and a coolant outlet, and wherein the coolant outlet is configured for a coolant connection with an electrical motor.

24. The motor drive converter of claim 12, wherein the conductor is structured to provide a force toward the cold plate for the at least one motor phase power electronics and/or the capacitor array.

\* \* \* \* \*